US010834814B2

(12) United States Patent
Cho et al.

(10) Patent No.: US 10,834,814 B2
(45) Date of Patent: Nov. 10, 2020

(54) FOLDABLE ELECTRONIC DEVICE AND CONTROL METHOD THEREOF

(71) Applicant: SAMSUNG ELECTRONICS CO., LTD., Suwon-si (KR)

(72) Inventors: Shiyun Cho, Anyang-si (KR); Hoseong Seo, Suwon-si (KR); Soyoung Kim, Suwon-si (KR); Inkuk Yun, Suwon-si (KR); Eunhwa Lee, Suwon-si (KR); Younho Choi, Seoul (KR); Jae-Young Huh, Seoul (KR); Woongeun Kwak, Seongnam-si (KR); Daemyung Kim, Hwaseong-si (KR); Daehyun Kim, Hwaseong-si (KR); Dohun Cha, Yongin-si (KR); Jungsik Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/903,374

(22) Filed: Feb. 23, 2018

(65) Prior Publication Data
US 2018/0242446 A1    Aug. 23, 2018

(30) Foreign Application Priority Data
Feb. 23, 2017    (KR) .................. 10-2017-0024240

(51) Int. Cl.
*H05K 1/02*    (2006.01)
*H05K 5/02*    (2006.01)
(Continued)

(52) U.S. Cl.
CPC ......... *H05K 1/0281* (2013.01); *G06F 1/1641* (2013.01); *G06F 1/1652* (2013.01);
(Continued)

(58) Field of Classification Search
CPC ...... G06F 1/1641; G06F 1/1652; G06F 3/041; G06F 1/1681; G06F 1/1616;
(Continued)

(56) References Cited

U.S. PATENT DOCUMENTS 7,032,984 B2 *  4/2006  Kim ...................... G06F 1/1601
                                                        312/223.2
7,830,333 B2 * 11/2010  Aoki ..................... G06F 1/1601
                                                        345/1.3
(Continued)

FOREIGN PATENT DOCUMENTS

| KR | 10-1559091 | 10/2015 |
| KR | 10-2016-0057225 | 5/2016 |
| WO | 2016/196038 | 12/2010 |

OTHER PUBLICATIONS

Extended Search Report dated Jun. 27, 2018 in counterpart European Patent Application No. EP18158209.9.
(Continued)

*Primary Examiner* — Michael J Jansen, II
(74) *Attorney, Agent, or Firm* — Nixon & Vanderhye P.C.

(57) ABSTRACT

Provided are foldable electronic device and a control method of the foldable electronic device. For example, disclosed are a foldable electronic device including a support sheet that supports a display in a common curved region and a control method of the foldable electronic device. According to disclosed embodiments, provided are a foldable electronic device including a support sheet that supports a display under the display folded in a common curved region of the folded electronic device, and a control method of the foldable electronic device.

20 Claims, 29 Drawing Sheets

(51) Int. Cl.
*H04M 1/02* (2006.01)
*G06F 3/041* (2006.01)
*H05K 1/14* (2006.01)
*G06F 1/16* (2006.01)

(52) U.S. Cl.
CPC .......... *G06F 3/041* (2013.01); *H04M 1/0247* (2013.01); *H04M 1/0268* (2013.01); *H05K 1/148* (2013.01); *H05K 5/0226* (2013.01)

(58) Field of Classification Search
CPC ............. H04M 1/0247; H04M 1/0268; H04M 1/0206; H04M 1/0214; H04M 1/0218; H05K 1/0281; H05K 1/148; H05K 5/0226; G02C 5/2236
See application file for complete search history.

(56) References Cited

U.S. PATENT DOCUMENTS

| | | | | |
|---|---|---|---|---|
| 8,170,631 B2* | 5/2012 | Aoki | | G06F 1/1616 |
| | | | | 361/679.56 |
| 8,379,378 B2* | 2/2013 | Visser | | G06F 1/1616 |
| | | | | 361/679.27 |
| 8,787,016 B2* | 7/2014 | Rothkopf | | H04M 1/0216 |
| | | | | 361/679.55 |
| 8,803,816 B2* | 8/2014 | Kilpatrick, II | | G06F 1/1616 |
| | | | | 345/173 |
| 8,804,349 B2* | 8/2014 | Lee | | G06F 1/1641 |
| | | | | 361/749 |
| 8,971,032 B2* | 3/2015 | Griffin | | G06F 1/1652 |
| | | | | 345/156 |
| 9,013,458 B2 | 4/2015 | Cho et al. | | |
| 9,013,864 B2* | 4/2015 | Griffin | | H04M 1/0216 |
| | | | | 16/382 |
| 9,021,657 B2* | 5/2015 | Park | | H05K 5/0226 |
| | | | | 16/354 |
| 9,047,055 B2* | 6/2015 | Song | | E05D 3/14 |
| 9,142,162 B2* | 9/2015 | Kwack | | G09G 3/3225 |
| 9,164,547 B1* | 10/2015 | Kwon | | G06F 1/1656 |
| 9,176,535 B2* | 11/2015 | Bohn | | G06F 1/1641 |
| 9,204,565 B1* | 12/2015 | Lee | | E05D 7/00 |
| 9,239,594 B2* | 1/2016 | Lee | | G06F 1/1652 |
| 9,250,851 B2* | 2/2016 | Lu | | G06F 3/1446 |
| 9,348,362 B2* | 5/2016 | Ko | | G06F 1/1626 |
| 9,348,369 B2* | 5/2016 | Kee | | G06F 1/1616 |
| 9,348,450 B1* | 5/2016 | Kim | | G06F 1/1681 |
| 9,471,111 B2* | 10/2016 | Huang | | E05D 7/06 |
| 9,506,279 B2* | 11/2016 | Kauhaniemi | | G06F 1/1652 |
| 9,572,272 B2* | 2/2017 | Lee | | H04M 1/0216 |
| 9,606,583 B2* | 3/2017 | Ahn | | G06F 1/1641 |
| 9,625,953 B2* | 4/2017 | Bitz | | G06F 1/1681 |
| 9,786,207 B2* | 10/2017 | Kim | | G09F 9/301 |
| 9,811,119 B2* | 11/2017 | Seo | | G06F 1/1652 |
| 9,823,699 B2* | 11/2017 | Ko | | G06F 1/1626 |
| 9,851,759 B2* | 12/2017 | Tazbaz | | G06F 1/1681 |
| 9,898,051 B2* | 2/2018 | Cho | | G06F 1/1616 |
| 9,939,847 B2* | 4/2018 | Kee | | G06F 1/1616 |
| 9,964,995 B1* | 5/2018 | Morrison | | H01Q 1/243 |
| 9,992,888 B2* | 6/2018 | Moon | | G06F 1/1618 |
| 10,001,810 B2* | 6/2018 | Yoo | | G06F 1/1626 |
| 10,021,795 B2* | 7/2018 | Hsu | | H04M 1/0268 |
| 10,062,362 B2* | 8/2018 | Kwak | | G06F 3/147 |
| 10,104,790 B2* | 10/2018 | Lee | | E05D 11/0054 |
| 10,140,018 B2* | 11/2018 | Kim | | G06F 1/1624 |
| 10,143,098 B1* | 11/2018 | Lee | | G06F 1/1652 |
| 10,180,701 B2* | 1/2019 | Nakamura | | G06F 1/1616 |
| 10,228,724 B2* | 3/2019 | Nakamura | | G06F 3/041 |
| 10,231,347 B2* | 3/2019 | Seo | | E05D 3/06 |
| 10,306,788 B2* | 5/2019 | Bi | | G02F 1/13 |
| 10,310,565 B2* | 6/2019 | Aoki | | G06F 1/1652 |
| 10,331,247 B2* | 6/2019 | Jinbo | | G06F 3/0412 |
| 10,383,241 B2* | 8/2019 | Lin | | F16C 11/04 |
| 10,394,274 B2* | 8/2019 | Ramaswamy | | G06F 1/1652 |
| 10,394,282 B2* | 8/2019 | Lee | | G06F 1/1652 |
| 10,416,726 B2* | 9/2019 | Lin | | G06F 1/1681 |
| 10,420,233 B2* | 9/2019 | Lee | | H04M 1/0268 |
| 10,429,894 B2* | 10/2019 | Xia | | G06F 1/1641 |
| 10,491,987 B2* | 11/2019 | Huh | | H04R 17/02 |
| 10,575,415 B2* | 2/2020 | Shin | | H05K 5/0017 |
| 10,694,623 B2* | 6/2020 | Park | | H05K 5/0017 |
| 2002/0104769 A1* | 8/2002 | Kim | | G06F 1/1601 |
| | | | | 206/320 |
| 2008/0144265 A1* | 6/2008 | Aoki | | G06F 1/1601 |
| | | | | 361/679.04 |
| 2010/0064244 A1* | 3/2010 | Kilpatrick, II | | G06F 1/1616 |
| | | | | 715/773 |
| 2010/0246103 A1* | 9/2010 | Visser | | G06F 1/1616 |
| | | | | 361/679.01 |
| 2010/0289730 A1* | 11/2010 | Aoki | | G06F 1/1616 |
| | | | | 345/76 |
| 2012/0307423 A1* | 12/2012 | Bohn | | G06F 1/1641 |
| | | | | 361/679.01 |
| 2013/0010405 A1* | 1/2013 | Rothkopf | | H04M 1/0216 |
| | | | | 361/679.01 |
| 2013/0307816 A1* | 11/2013 | Lee | | G06F 1/1652 |
| | | | | 345/174 |
| 2013/0342439 A1* | 12/2013 | Kwack | | G09G 3/3225 |
| | | | | 345/156 |
| 2014/0062856 A1* | 3/2014 | Lu | | G06F 3/1446 |
| | | | | 345/156 |
| 2014/0111954 A1* | 4/2014 | Lee | | G06F 1/1641 |
| | | | | 361/749 |
| 2014/0123436 A1* | 5/2014 | Griffin | | H04M 1/0216 |
| | | | | 16/221 |
| 2014/0126121 A1* | 5/2014 | Griffin | | H04M 1/0216 |
| | | | | 361/679.01 |
| 2014/0126133 A1* | 5/2014 | Griffin | | G06F 1/1616 |
| | | | | 361/679.27 |
| 2014/0196254 A1* | 7/2014 | Song | | E05D 3/14 |
| | | | | 16/302 |
| 2014/0217875 A1* | 8/2014 | Park | | H05K 5/0226 |
| | | | | 312/326 |
| 2014/0226275 A1* | 8/2014 | Ko | | G06F 1/1626 |
| | | | | 361/679.27 |
| 2014/0355195 A1* | 12/2014 | Kee | | G06F 1/1616 |
| | | | | 361/679.27 |
| 2015/0055287 A1* | 2/2015 | Seo | | G06F 1/1652 |
| | | | | 361/679.27 |
| 2015/0131222 A1* | 5/2015 | Kauhaniemi | | G06F 1/1652 |
| | | | | 361/679.27 |
| 2015/0257290 A1* | 9/2015 | Lee | | H04M 1/0216 |
| | | | | 361/749 |
| 2015/0370287 A1* | 12/2015 | Ko | | G06F 1/1626 |
| | | | | 361/749 |
| 2016/0062408 A1* | 3/2016 | Lee | | G06F 1/1641 |
| | | | | 345/173 |
| 2016/0103539 A1* | 4/2016 | Jinbo | | G06F 3/0412 |
| | | | | 345/173 |
| 2016/0132076 A1* | 5/2016 | Bitz | | G06F 1/1681 |
| | | | | 361/679.27 |
| 2016/0139634 A1* | 5/2016 | Cho | | G06F 1/1652 |
| | | | | 361/679.27 |
| 2016/0187935 A1* | 6/2016 | Tazbaz | | G06F 1/1681 |
| | | | | 361/679.03 |
| 2016/0224072 A1* | 8/2016 | Huang | | E05D 7/06 |
| 2016/0266612 A1* | 9/2016 | Kee | | G06F 1/1616 |
| 2016/0324023 A1* | 11/2016 | Kim | | G06F 1/1624 |
| 2016/0349802 A1* | 12/2016 | Ahn | | G06F 1/1641 |
| 2016/0357318 A1* | 12/2016 | Chan | | G06F 1/1626 |
| 2017/0061836 A1* | 3/2017 | Kim | | G09F 9/301 |
| 2017/0069299 A1* | 3/2017 | Kwak | | G06F 3/147 |
| 2017/0142847 A1* | 5/2017 | Park | | H05K 5/0017 |
| 2017/0235343 A1* | 8/2017 | Cho | | G06F 1/1616 |
| | | | | 361/679.27 |
| 2017/0374749 A1* | 12/2017 | Lee | | E05D 11/0054 |
| 2018/0011515 A1* | 1/2018 | Yoo | | G06F 1/1626 |
| 2018/0024589 A1* | 1/2018 | Nakamura | | G06F 1/1616 |
| | | | | 361/679.09 |
| 2018/0024590 A1* | 1/2018 | Nakamura | | G06F 3/041 |
| | | | | 349/58 |

(56) References Cited

U.S. PATENT DOCUMENTS

| | | | |
|---|---|---|---|
| 2018/0024593 A1* | 1/2018 | Seo | G06F 1/1652 |
| | | | 361/679.27 |
| 2018/0049329 A1* | 2/2018 | Seo | E05D 3/06 |
| 2018/0059718 A1* | 3/2018 | Ramaswamy | G06F 1/1616 |
| 2018/0077810 A1* | 3/2018 | Moon | G06F 1/1618 |
| 2018/0092223 A1* | 3/2018 | Hsu | G06F 1/1681 |
| 2018/0109871 A1* | 4/2018 | Huh | G06F 1/1652 |
| 2018/0150112 A1* | 5/2018 | Aoki | G06F 1/1652 |
| 2018/0210513 A1* | 7/2018 | Lin | G06F 1/1641 |
| 2018/0213663 A1* | 7/2018 | Lin | G06F 1/1618 |
| 2018/0242446 A1* | 8/2018 | Cho | H05K 1/0281 |
| 2018/0314299 A1* | 11/2018 | Xia | G09F 9/30 |
| 2018/0317333 A1* | 11/2018 | Bi | G02F 1/13 |
| 2018/0324964 A1* | 11/2018 | Yoo | H05K 5/0226 |
| 2019/0032380 A1* | 1/2019 | Wu | H04M 1/0216 |
| 2019/0069421 A1* | 2/2019 | Lee | G06F 1/1652 |
| 2019/0090364 A1* | 3/2019 | Shin | H05K 5/0017 |

OTHER PUBLICATIONS

European Office Action dated Aug. 18, 2020 for European Application No. 18158209.9.

\* cited by examiner

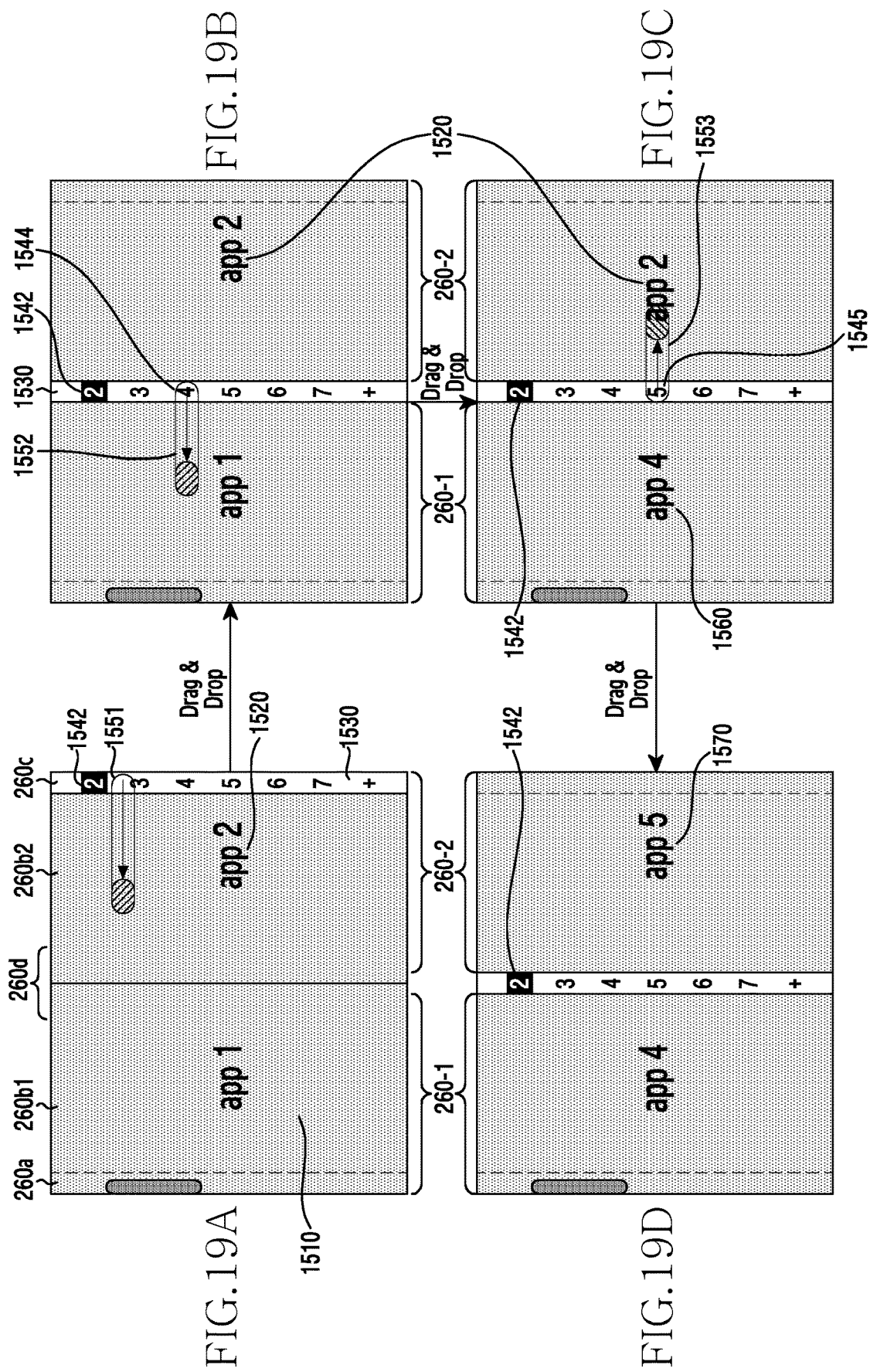

FOLDABLE ELECTRONIC DEVICE AND CONTROL METHOD THEREOF

CROSS-REFERENCE TO RELATED APPLICATION

This application is based on and claims priority under 35 U.S.C. § 119 to Korean Patent Application Serial No. 10-2017-0024240, which was filed in the Korean Intellectual Property Office on Feb. 23, 2017, the content of which is incorporated by reference herein in its entirety.

TECHNICAL FIELD

The present disclosure relates generally to a foldable electronic device and a control method thereof.

BACKGROUND

As technologies have developed, electronic devices are capable of providing a multitasking function, a call function, and a data transmission function, or providing a variety of services and functions through a variety of applications.

In the electronic devices including a screen on the front faces thereof, the size of the screen has been gradually increased, and various services can be provided to a user through a large screen. However, the increase of the screen size is limited by a camera, a receiver, or a sensor located in the upper end of the front face, a home button located in the lower end of the front face, or the like.

SUMMARY

According to various example embodiments of the present disclosure, it is possible to provide a foldable electronic device including a support sheet that supports a display in a folded common curved region of the electronic device, and a method of controlling the foldable electronic device.

An electronic device according to an example embodiment includes: a first housing including a first face facing a first direction, and a second face facing a second direction opposite the first direction; a second housing including a third face facing the third direction, and a fourth face facing the fourth direction opposite the third direction; a touch screen display continuously disposed between the first face and the second face of the first housing and between the third face and the fourth face of the second housing, the touch screen being exposed through the first face of the first housing and the third face of the second housing, the touch screen display further including a flat region and a plurality of curved regions; a hinge configured to connect the first housing and the second housing to each other; a hinge cover located outside the hinge; and a support sheet positioned under a common curved region formed in a central region of the flat region corresponding to the touch screen display, and configured to support the folded touch screen display under the common curved region.

An electronic device according to an example embodiment includes: a first housing including a first face facing a first direction, and a second face facing a second direction opposite to the first direction; a second housing including a third face facing the third direction, and a fourth face facing the fourth direction opposite the third direction; a touch screen display continuously disposed between the first face of the first housing and the second face of the first housing and between the third face of the second housing and the fourth face of the second housing, the touch screen display being exposed through the first face of the first housing and the third face of the second housing, the touch screen including a flat region and a plurality of curved regions; a hinge configured to connect the first housing and the second housing wherein the first housing is folded respect to the second housing using the hinge; and a support sheet positioned under a common curved region, formed in a central region of the flat region corresponding to the touch screen display, and configured to support a folded touch screen display under the common curved region.

BRIEF DESCRIPTION OF THE DRAWINGS

The above and/or other aspects, features, and attendant advantages of the present disclosure will be more apparent and readily appreciated from the following detailed description, taken in conjunction with the accompanying drawings, in which like reference numerals refer to like elements, and wherein:

FIGS. 19A, 19B, 19C and 19D are diagrams illustrating an example of a control method of an example electronic device according to an example embodiment of the present disclosure.

DETAILED DESCRIPTION

Figure 1:
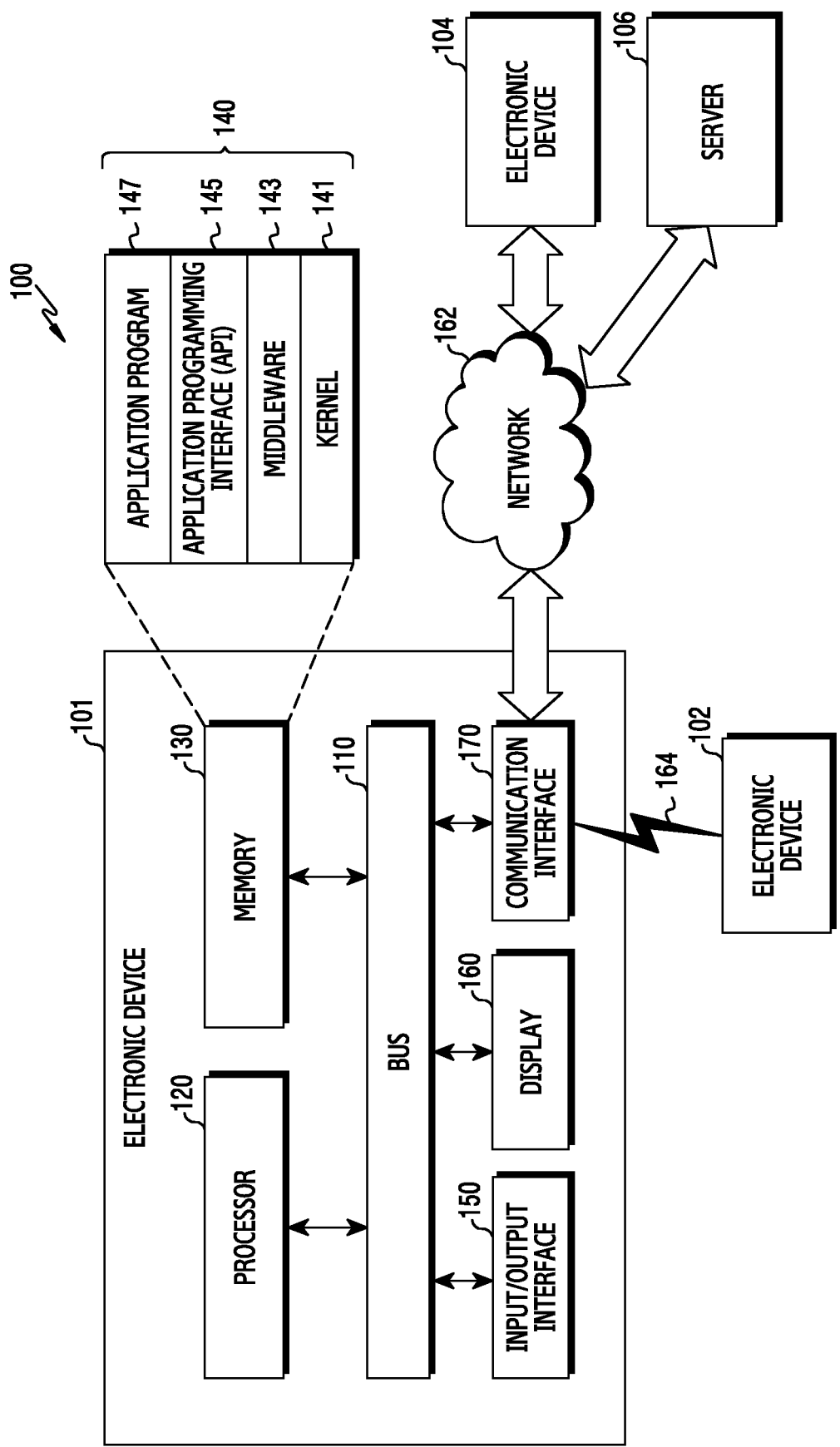
FIG. 1 is a diagram illustrating an example electronic device in a network environment according to various example embodiments of the present disclosure.

Various example embodiments of the present disclosure are described in greater detail with reference to the accompanying drawings. It should be understood that it is not intended to limit various embodiments and terms of the present disclosure to a particular form but, instead, the intention is to cover various modifications, equivalents, and/or alternatives of the embodiments of the present disclosure. The same or similar components may be designated by the same or similar reference numerals although they are illustrated in different drawings. It is to be understood that the singular forms include plural referents unless the context clearly dictates otherwise.

In the present disclosure, an expression such as "A or B," "at least one of A and B," or "one or more of A and B" may include all possible combinations of the listed items.

Expressions such as "first," "second," "primarily," or "secondary," as used herein, may represent various elements regardless of order and/or importance and do not limit corresponding elements. The expressions may be used for distinguishing one element from another element.

When it is described that an element (such as a first element) is "(operatively or communicatively) coupled" to or "connected" to another element (such as a second element), the element can be directly connected to the other element or can be connected through another element (such as a third element).

An expression "configured to (or set)" used in the present disclosure may be used interchangeably with, for example, "suitable for," "having the capacity to," "designed to," "adapted to," "made to," or "capable of" by hardware and/or by software according to a situation. Alternatively, in some situations, the expression "apparatus configured to" may refer, for example, to a situation in which the apparatus "can" operate together with another apparatus or component. For example, a phrase "a processor configured (or set) to perform A, B, and C" may refer, for example, and without limitation, to a dedicated processor, a generic-purpose processor (such as a Central Processing Unit (CPU) or an application processor), or the like, that can perform a corresponding operation by executing at least one software program stored at an exclusive processor (such as an embedded processor) for performing a corresponding operation or at a memory device, or the like, but is not limited thereto.

An electronic device according to various example embodiments of the present disclosure, may be, for example, at least one of a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), an MPEG 3 (MP3) player, a medical equipment, a camera, and a wearable device, or the like, but is not limited thereto.

The wearable device can include at least one of an accessory type (e.g., a watch, a ring, a bracelet, an ankle bracelet, a necklace, glasses, a contact lens, or a Head-Mounted-Device (HMD)), a fabric or clothing embedded type (e.g., electronic garments), a body attachable type (e.g., a skin pad or a tattoo), and an implantable circuit, or the like, but is not limited thereto.

The electronic device can include as at least one of, for example, a television, a Digital Versatile Disc (DVD) player, an audio device, a refrigerator, an air-conditioner, a cleaner, an oven, a microwave oven, a washing machine, an air cleaner, a set-top box, a home automation control panel, a security control panel, a media box (e.g., Samsung Home-Sync™, Apple TV™, or Google TV™), a game console (e.g., Xbox™, PlayStation™), an electronic dictionary, an electronic key, a camcorder, and an electronic frame, or the like, but is not limited thereto.

In another example embodiment, the electronic device can include as at least one of various medical devices (such as, various portable medical measuring devices (a blood sugar measuring device, a heartbeat measuring device, a blood pressure measuring device, or a body temperature measuring device), a Magnetic Resonance Angiography (MRA) device, a Magnetic Resonance Imaging (MRI) device, a Computed Tomography (CT) device, a scanning machine, and an ultrasonic wave device), a navigation device, a Global Navigation Satellite System (GNSS), an Event Data Recorder (EDR), a Flight Data Recorder (FDR), a vehicle infotainment device, electronic equipment for ship (such as, a navigation device for ship and gyro compass), avionics, a security device, a head unit for a vehicle, an industrial or home robot, a drone, an Automated Teller Machine (ATM) of a financial institution, a Point Of Sales (POS) device of a store, and an Internet of Things (IoT) device (e.g., a light bulb, various sensors, a sprinkler device, a fire alarm, a thermostat, a street light, a toaster, sports equipment, a hot water tank, a heater, and a boiler), or the like, but is not limited thereto.

According to an example embodiment, the electronic device can include at least one of a portion of furniture, building/construction or vehicle, an electronic board, an electronic signature receiving device, a projector, and various measuring devices (e.g., water supply, electricity, gas, or electric wave measuring device), or the like, but is not limited thereto.

An electronic device, according to various embodiments, can be a flexible electronic device or a combination of two or more of the foregoing various devices. An electronic device, according to an embodiment of the present disclosure, is not limited to the foregoing devices.

The term "user", as used herein, can refer to a person using an electronic device or a device using an electronic device (e.g., an artificial intelligence electronic device).

Referring initially to FIG. 1, an electronic device 101 resides in a network environment 100. The electronic device 101 can include a bus 110, a processor (e.g., including processing circuitry) 120, a memory 130, an input/output interface (e.g., including input/output interface circuitry) 150, a display 160, and a communication interface (e.g., including communication circuitry) 170. The electronic device 101 can be provided without at least one of the components, or can include at least one additional component.

The bus 110 can include a circuit for connecting the components 120 through 170 and delivering communication (e.g., control messages or data) therebetween.

The processor 120 may include various processing circuitry, such as, for example, and without limitation, one or more of a dedicated processor, a CPU, an application processor, and a Communication Processor (CP). The processor 120, for example, can perform an operation or data processing with respect to control and/or communication of at least another component of the electronic device 101.

The memory 130 can include a volatile and/or nonvolatile memory. The memory 130, for example, can store commands or data associated with at least another component of the electronic device 101. According to an embodiment, the memory 130 can store software and/or a program 140. The program 140 can include, for example, a kernel 141, middleware 143, an Application Programming Interface (API) 145, and/or an application program (or "application") 147. At least part of the kernel 141, the middleware 143, or the API 145 can be referred to as an Operating System (OS).

The kernel 141 can control or manage system resources (e.g., the bus 110, the processor 120, or the memory 130) used for performing operations or functions implemented by the other programs (e.g., the middleware 143, the API 145, or the application program 147). Additionally, the kernel 141 can provide an interface for controlling or managing system resources by accessing an individual component of the electronic device 101 from the middleware 143, the API 145, or the application program 147.

The middleware 143, for example, can serve an intermediary role for exchanging data between the API 145 or the application program 147 and the kernel 141 through communication. Also, the middleware 143 can process one or more job requests received from the application program 147, based on their priority. For example, the middleware 143 can assign a priority for using a system resource (e.g., the bus 110, the processor 120, or the memory 130) of the electronic device 101 to at least one of the application program 147, and process the one or more job requests.

The API 145, as an interface through which the application program 147 controls a function provided from the kernel 141 or the middleware 143, can include, for example, at least one interface or function (e.g., an instruction) for file control, window control, image processing, or character control.

The input/output interface 150, for example, may include various input/output circuitry and can deliver commands or data inputted from a user or another external device to other component(s) of the electronic device 101, or output commands or data inputted from the other component(s) of the electronic device 101 to the user or another external device.

The display 160, for example, can include a Liquid Crystal Display (LCD), a Light Emitting Diode (LED) display, an Organic Light Emitting Diode (OLED) display, a Micro Electro Mechanical Systems (MEMS) display, or an electronic paper display, or the like, but is not limited thereto. The display 160, for example, can display various contents (e.g., texts, images, videos, icons, and/or symbols) to the user. The display 160 can include a touch screen, for example, and receive touch, gesture, proximity, or hovering inputs by using an electronic pen or a user's body part.

The communication interface 170, for example, can set a communication between the electronic device 101 and an external device (e.g., a first external electronic device 102, a second external electronic device 104, or a server 106). For example, the communication interface 170 can communicate with the external device (e.g., the second external electronic device 104 or the server 106) over a network 162 through wireless communication or wired communication. Additionally, or alternatively, the communication interface 170 can establish a short-range wireless communication connection 164 with an electronic device (e.g., the first external electronic device 102).

The wireless communication, for example, can include cellular communication using at least one of Long Term Evolution (LTE), LTE-Advanced (LTE-A), Code Division Multiple Access (CDMA), Wideband CDMA (WCDMA), Universal Mobile Telecommunications System (UMTS), Wireless Broadband (WiBro), or Global System for Mobile Communications (GSM). The wireless communication can include, for example, at least one of Wireless Fidelity (WiFi), Bluetooth, Bluetooth Low Energy (BLE), Zigbee, Near Field Communication (NFC), magnetic secure transmission, Radio Frequency (RF), and Body Area Network (BAN). The wireless communication can include GNSS. The GNSS can include, for example, Global Positioning System (GPS), Global Navigation Satellite System (GLONASS), Beidou navigation satellite system (Beidou), or Galileo (the European global satellite-based navigation system). Hereafter, the GPS can be interchangeably used with the GNSS. The wired communication, for example, can include at least one of Universal Serial Bus (USB), High Definition Multimedia Interface (HDMI), Recommended Standard 232 (RS-232), power line communications, and Plain Old Telephone Service (POTS). The network 162 can include a telecommunications network, for example, at least one of computer network (e.g., LAN or WAN), Internet, and telephone network.

Each of the first and second external electronic devices 102 and 104 can be of the same as or of a different type from that of the electronic device 101. According to various embodiments of the present disclosure, all or part of operations executed in the electronic device 101 can be executed by another electronic device or a plurality of electronic devices (e.g., the electronic device 102 or 104, or the server 106). To perform a function or service automatically or by request, instead of performing the function or the service by the electronic device 101, the electronic device 101 can request at least part of a function relating thereto from another device (e.g., the electronic device 102 or 104, or the server 106). The other electronic device (e.g., the electronic device 102 or 104, or the server 106) can perform the requested function or an additional function and send its result to the electronic device 101. The electronic device 101 can provide the requested function or service by processing the received result. In doing so, for example, cloud computing, distributed computing, or client-server computing techniques can be used.

Figure 2:
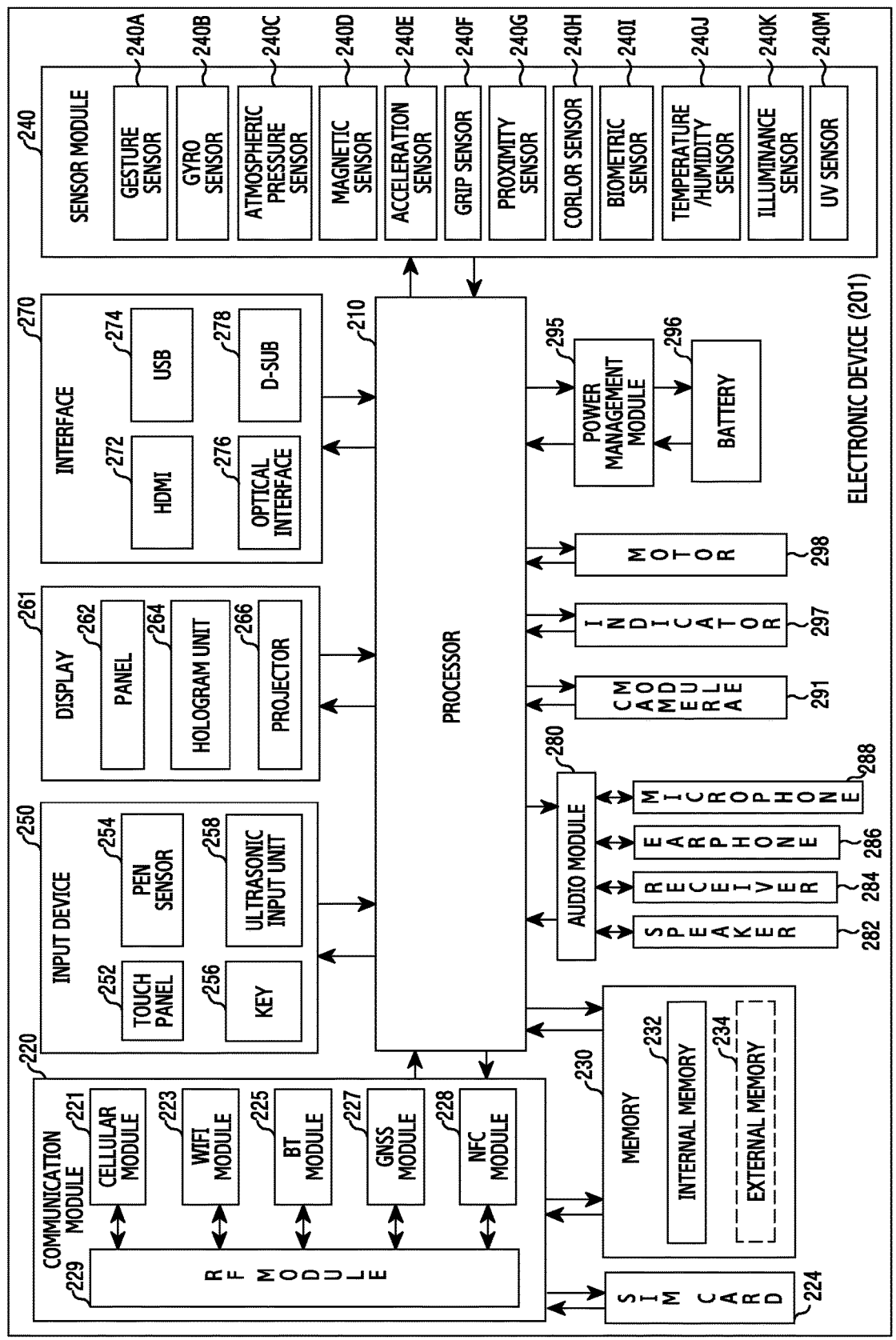
FIG. 2 is a block diagram illustrating an example electronic device according to various example embodiments of the present disclosure.

FIG. 2 is a block diagram illustrating an example electronic device according to an example embodiment of the present disclosure.

Referring to FIG. 2, an electronic device 201 may, for example, include the entire or part of the electronic device 101 illustrated in FIG. 1. The electronic device 201 may include one or more processors (e.g., application processor (APs)) 210, a communication module 220, a subscriber identification module 224, a memory 230, a sensor module 240, an input device 250, a display 261, an interface 270, an audio module 280, a camera module 291, a power management module 295, a battery 296, an indicator 297 and a motor 298.

The processor 210 may, for example, include various processing circuitry and drive an operating system or an application program to control a majority of hardware or software constituent elements coupled to the processor 210, and may perform various data processing and operations. The processor 210 may be, for example, implemented as a system on chip (SoC). According to an embodiment, the processor 210 may further include a graphic processing unit (GPU) and/or an image signal processor (ISP). The processor 210 may include at least some (e.g., cellular module 221) of the constituent elements illustrated in FIG. 2 as well. The processor 210 may load a command or data received from at least one of the other constituent elements (e.g., non-volatile memory), to a volatile memory, to process the loaded command or data, and store the result data in the non-volatile memory.

According to an embodiment, the processor 210 may control at least a partial function of a light emitting unit and/or light receiving unit of a spectrometric sensing apparatus (not shown) based on at least one mode. For example, the processor 210 may control the light emitting unit to selectively output light of a wavelength band corresponding to the at least one mode. For another example, the light emitting unit may include a majority of light sources for outputting light of mutually different wavelength bands respectively, and the processor 210 may selectively activate at least one of the majority of light sources based on the at least one mode as well. According to various embodiments, the processor 210 may selectively activate at least a part of at least one region of the light receiving unit based on the at least one mode. According to various embodiments, the processor 210 may acquire information related with the at least one mode based on light that is acquired through the light receiving unit, and display the acquired information through the display 261. According to various embodiments, the processor 210 may acquire the information related with the at least one mode based on the light that is acquired through the light receiving unit, and transmit the acquired information to another electronic device (e.g., 102, 104 or 106 of FIG. 1) through the communication module 220.

The communication module 220 may, for example, have the same or similar construction with the communication interface 170. The communication module 220 may include various communication circuitry, such as, for example, and without limitation, a cellular module 221, a WiFi module 223, a Bluetooth module 225, a GNSS module 227, an near field communication (NFC) module 228, and a radio frequency (RF) module 229, or the like. The cellular module 221 may, for example, provide voice telephony, video telephony, a text service, an Internet service or the like through a telecommunication network. According to an embodiment, the cellular module 221 may perform the distinction and authentication of the electronic device 201 within the telecommunication network, by using the subscriber identification module (e.g., SIM card) 224. According to an embodiment, the cellular module 221 may perform at least some functions among functions that the processor 210 may provide. According to an embodiment, the cellular module 221 may include a communication processor (CP). According to some embodiment, at least some (e.g., two or more) of the cellular module 221, the WiFi module 223, the Bluetooth module 225, the GNSS module 227 or the NFC module 228 may be included within one integrated chip (IC) or IC package. The RF module 229 may, for example, transceive a communication signal (e.g., RF signal). The RF module 229 may, for example, include a transceiver, a power amplifier module (PAM), a frequency filter, a low noise amplifier (LNA), an antenna or the like. According to another embodiment, at least one of the cellular module 221, the WiFi module 223, the Bluetooth module 225, the GNSS module 227 or the NFC module 228 may transceive an RF signal through a separate RF module.

The subscriber identification module 224 may, for example, include a card including a subscriber identification module and/or an embedded SIM. And, the subscriber identification module 224 may include unique identification information (e.g., integrated circuit card identifier (ICCID)) or subscriber information (e.g., international mobile subscriber identity (IMSI)).

The memory 230 (e.g., memory 130) may, for example, include an internal memory 232 and/or an external memory 234. The internal memory 232 may, for example, include at least one of a volatile memory (e.g., a dynamic random access memory (DRAM), a static RAM (SRAM), a synchronous dynamic RAM (SDRAM) or the like) and a non-volatile memory (e.g., one time programmable read only memory (OTPROM), a programmable ROM (PROM), an erasable PROM (EPROM), an electrically EPROM (EEPROM), a mask ROM, a flash ROM, a flash memory, a hard drive or a solid state drive (SSD)). The external memory 234 may include a flash drive, for example, a compact flash (CF), a secure digital (SD), a micro-SD, a mini-SD, an extreme Digital (xD), a Multi Media Card (MMC), a memory stick or the like. The external memory 234 may be operatively or physically coupled with the electronic device 201 through various interfaces.

The sensor module 240 may, for example, measure a physical quantity or sense an activation state of the electronic device 201, to convert measured or sensed information into an electrical signal. The sensor module 240 may, for example, include at least one of a gesture sensor 240A, a gyro sensor 240B, a barometer (or atmospheric pressure sensor) 240C, a magnetic sensor 240D, an acceleration sensor 240E, a grip sensor 240F, a proximity sensor 240G, a color sensor 240H (e.g., a red, green, blue (RGB) sensor), a biometric sensor 240I, a temperature/humidity sensor 240J, and an illumination sensor 240K or an ultra violet (UV) sensor 240M. Additionally or alternatively, the sensor module 240 may, for example, include an E-nose sensor, an electromyography (EMG) sensor, an electroencephalogram (EEG) sensor, an electrocardiogram (ECG) sensor, an infrared (IR) sensor, an iris scan sensor and/or a finger scan sensor. The sensor module 240 may further include a control circuit for controlling at least one or more sensors belonging therein. In some embodiment, the electronic device 201 may further include a processor configured to control the sensor module 240 as a part of the processor 210 or separately, thereby controlling the sensor module 240 while the processor 210 is in a sleep state.

According to an embodiment, a spectrometric sensing apparatus (not shown) may include at least a part of at least one optical sensor (e.g., the gesture sensor 240A, the proximity sensor 240G or the RGB sensor 240H) of the sensor module 240. For example, the spectrometric sensing apparatus may use a light emitting unit (not shown) of the sensor module 240 that has at least one light source for outputting light of at least one wavelength band. The spectrometric sensing apparatus may include a light receiving unit (not shown) of the sensor module 240 that has at least one region for receiving light of at least one wavelength band.

The input device 250 may include various input circuitry, such as, for example, and without limitation, a touch panel 252, a (digital) pen sensor 254, a key 256 or an ultrasonic input unit 258, or the like. The touch panel 252 may, for example, use at least one scheme among a capacitive overlay scheme, a pressure sensitive scheme, an infrared beam scheme or an ultrasonic scheme. Also, the touch panel 252 may further include a control circuit as well. The touch panel 252 may further include a tactile layer, to provide a tactile response to a user. The (digital) pen sensor 254 may, for example, be a part of the touch panel 252, or include a separate sheet for recognition. The key 256 may, for example, include a physical button, an optical key or a keypad. The ultrasonic input unit 258 may sense an ultrasonic wave generated in an input tool, through a microphone (e.g., microphone 288), to confirm data corresponding to the sensed ultrasonic wave.

The display 261 (e.g., the display 160) may include a panel 262, a hologram unit 264, a projector 266, and/or a control circuit for controlling them. The panel 262 may, for example, be implemented to be flexible, transparent, or wearable. The panel 262 may be constructed as one or more modules together with the touch panel 252. The hologram unit 264 may show a three-dimensional image to the air using an interference of light. The projector 266 may project light onto a screen, to display an image. The screen may, for example, be located inside or outside the electronic device 201.

The interface 270 may include various interface circuitry, such as, for example, and without limitation, an HDMI 272, a USB 274, an optical interface 276 or a D-subminiature (D-sub) 278, or the like. The interface 270 may, for example, be included in the communication interface 170 illustrated in FIG. 1. Additionally or alternatively, the interface 270 may, for example, include a Mobile High-definition Link (MHL) interface, an SD card/Multi Media Card (MMC) interface or an Infrared Data Association (IrDA) standard interface.

The audio module 280 may, for example, convert a sound and an electrical signal interactively. At least some constituent elements of the audio module 280 may be, for example, included in the input output interface 150 illustrated in FIG. 1. The audio module 280 may for example, process sound information that is inputted or outputted through a speaker 282, a receiver 284, an earphone 286, the microphone 288 or the like. The camera module 291 is, for example, a device able to photograph a still image and a video. According to an embodiment, the camera module 291 may include one or more image sensors (e.g., front sensor or rear sensor), a lens, an image signal processor (ISP) or a flash (e.g., an LED, a xenon lamp or the like). The power management module 295 may, for example, manage the electric power of the electronic device 201. According to an embodiment, the power management module 295 may include a power management integrated circuit (PMIC), a charger IC or a battery or battery gauge. The PMIC may, for example, employ a wired and/or wireless charging scheme. The wireless charging scheme may, for example, include a magnetic resonance scheme, a magnetic induction scheme, an electromagnetic wave scheme or the like. And, the wireless charging scheme may further include a supplementary circuit for wireless charging, for example, a coil loop, a resonance circuit, a rectifier or the like. The battery gauge may, for example, measure a level of the battery 296, a voltage being in charge, an electric current or a temperature. The battery 296 may, for example, include a rechargeable battery and/or a solar battery.

The indicator 297 may display a specific state, for example, a booting state, a message state, a charging state or the like of the electronic device 201 or a part (e.g., processor 210) of the electronic device 201. The motor 298 may convert an electrical signal into a mechanical vibration, and may generate a vibration, a haptic effect or the like. The electronic device 201 may, for example, include a mobile TV support device (e.g., GPU) capable of processing media data according to the standards of digital multimedia broadcasting (DMB), digital video broadcasting (DVB), media-Flo™ or the like. Each of the constituent elements described in the present document may consist of one or more components, and a name of the corresponding constituent element may be varied according to the kind of the electronic device. In various embodiments, the electronic device (e.g., electronic device 201) may omit some constituent elements, or further include additional constituent elements, or combine some of the constituent elements to configure one entity, but identically perform functions of corresponding elements before combination.

Figure 3:
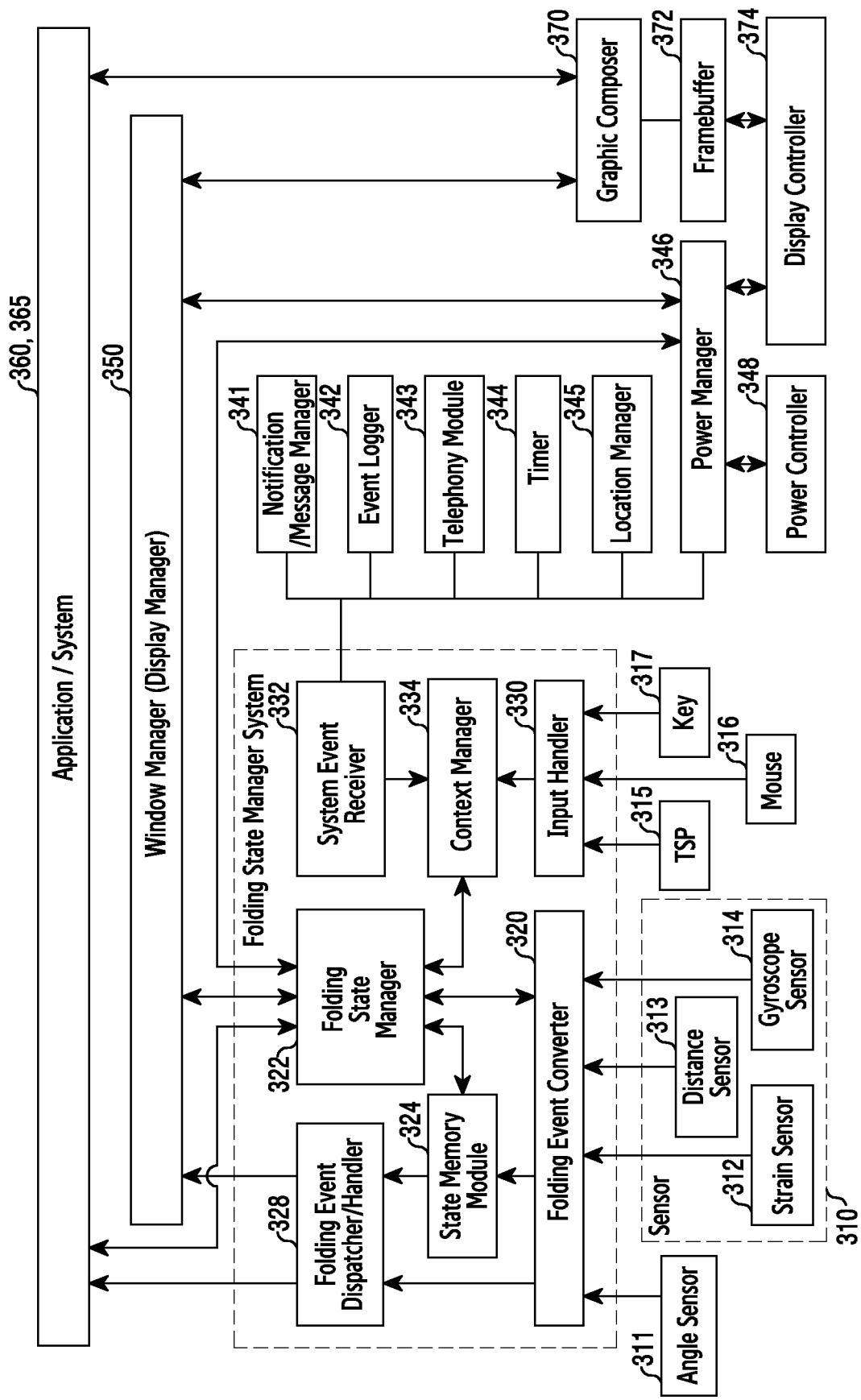
FIG. 3 is a block diagram illustrating an example program module according to various example embodiments of the present disclosure.

FIG. 3 is a block diagram illustrating an example program module according to various example embodiments of the present disclosure.

According to an example embodiment, a program module may include an operating system that controls resources associated with an electronic device (e.g., an electronic device 101 or 201) and/or various applications running on the operating system. The operating system may include, for example, Android™, iOS™, Windows™, Symbian™, Tizen™, or Bada™. At least some of the program modules may be preloaded on the electronic device or downloaded from an external electronic device (e.g., an electronic device 104 or a server 106).

A folding event converter 320 (also referred to as an "event converter") may analyze raw data received from a sensor 310 (e.g., a strain sensor 312, a distance sensor 313, or a gyroscope sensor 314) so as to calculate the folding state. Hereinafter, "folding" may be referred to as "bending," and a "folding event" may be referred to as a "folding gesture."

A folding event handler (or an event handler, or a folding event dispatcher) 328 may forward a folding state/event to a system (or an operating system) 365 or an application 360.

A folding state manager 322 may forward a folding state (or event) to a corresponding module.

A state memory module 324 may store a folding state/event.

A notification/message manager 341 may provide a user with events (e.g., an arrival message, an appointment, and a proximity notification).

An event logger 342 may record the events and display them in time order.

A telephony module 343 may manage a voice/video call function of the electronic device.

A timer 344 may provide a timer function.

A location manager 345 may manage, for example, position information of the electronic device.

A power manager 346 may be interlocked with, for example, a power controller 348 so as to manage the capacity or power of a battery and to provide power information required for the operation of the electronic device.

A system event receiver 332 may receive events from the notification/message manager 341, the event logger 342, the telephony module 343, the timer 344, or the power manager 346, and may transfer the events to a context manager 334.

An input handler 330 may receive inputs from a TSP 315, a mouse 316, or a key 317, and may forward the inputs to the context manager 334.

The context manager 334 may manage system services based on an input, a system event, a folding state, and the like.

A display controller 374 may control on/off of a screen.

A frame buffer 372 may store pixel values (or pixel color values) to be output to the display.

A graphic composer 370 may generate a screen including various objects, such as items, images, and text.

The window manager 350 may manage a GUI resource that is used in a screen.

An application 360 may include one or more applications for providing, for example, a home, a dialer, an SMS/MMS, an Instant Message (IM), a browser, a camera, an alarm, a contact, a voice dial, an e-mail, a calendar, a media player, an album, and a watch, health care information (e.g., measurement of a quantity of motion, or blood sugar), or environmental information (e.g., atmospheric pressure, humidity, or temperature information).

At least a part of a program module may be implemented (e.g., executed) by software, firmware, hardware (e.g., a processor), or a combination of at least two of them, and may include a module, a program, a routine, a command set, or a process for performing one or more functions.

FIGS. 4A, 4B, 4C and 4D are diagrams illustrating example program modules according to various example embodiments of the present disclosure.

Figure 4A:
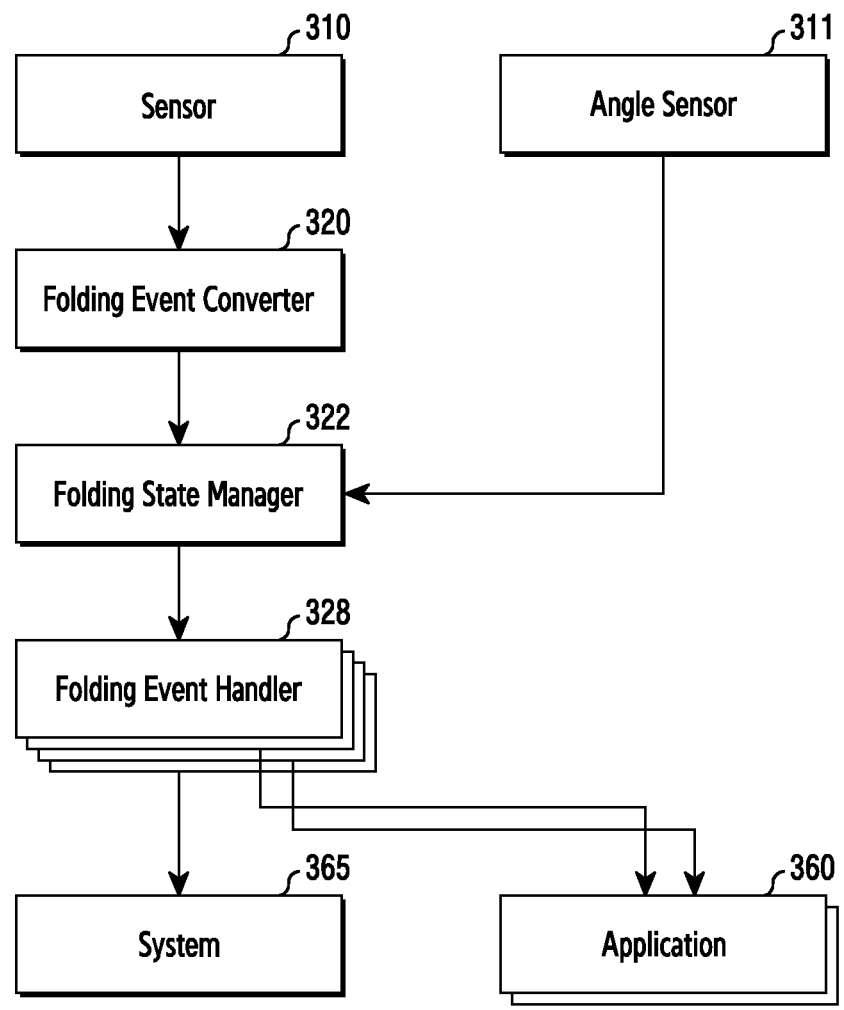
FIGS. 4A, 4B, 4C and 4D are diagrams illustrating example program modules according to various example embodiments of the present disclosure.

Referring to FIG. 4A, the folding event converter 320 may calculate the folding state by analyzing the raw data of the sensor 310. For example, the folding event converter 320 may calculate a folded angle of the electronic device by comparing an angle between the axis of a first sensor and the ground, which is measured by the first sensor including an angle sensor 311 (or a gyroscope sensor) and an angle between the axis of a second sensor and the ground, which is measured by a second sensor including a gyroscope sensor 314 (or an angle sensor).

For example, when a distance measured by a first sensor including a distance sensor 313 and a distance measured by a second sensor including a distance sensor 313 are equal to each other, it can be seen that the electronic device 301 is folded such that the first sensor and the second sensor are facing each other, and since the distance is proportional to the folded angle, the folded angle of the electronic device 301 can be calculated therefrom.

The folding state may be measured directly through the angle sensor 311, or may be determined through a calculation by the folding event converter 320. The folding state may be represented by the angle itself, by one state corresponding to a predetermined angle range, or by an angle-increasing/angle-decreasing trend.

The folding state manager 322 may acquire an information on the angle directly through the angle sensor 311 for measuring the folding state. The folding state manager 322 may acquire another information on the calculation regarding the folding state by the folding event converter 320. The folding state manager 322 forwards the folding state (or event) to the folding event handlers 328, and the folding state may be handled by registered folding event handlers 328. The folding event handlers 328 may be registered by various modules such as the system 365, the application 360, and a background service, and the registered folding event handlers (or dispatcher) 328 may handle folding states on the basis of the order of priority. For example, the order of priority may be determined in the following order: a system 365, a visible (or activated) application, an application running but directly invisible to the user, and a background service having no visible UI. For example, when a folding state/event is not handled by a high-priority event handler, the next-ranked event handler may handle the folding state/event.

Sequential processing of a folding state/event may have the following effects.

When the electronic device is folded, the system 365 may display an alpha screen or a gadget. For example, the alpha screen may be freely movable, and may be configured with a window that displays at least one of a multimedia content, user-customized information, real-time information, and the like. When a specific situation, such as a transverse mode, is given, the system 365 may not process a folding event, and when the folding event handler 328 with the next priority is registered in a video application, the video application may stop or start video playback according to a folding/unfolding event.

Figure 4B:
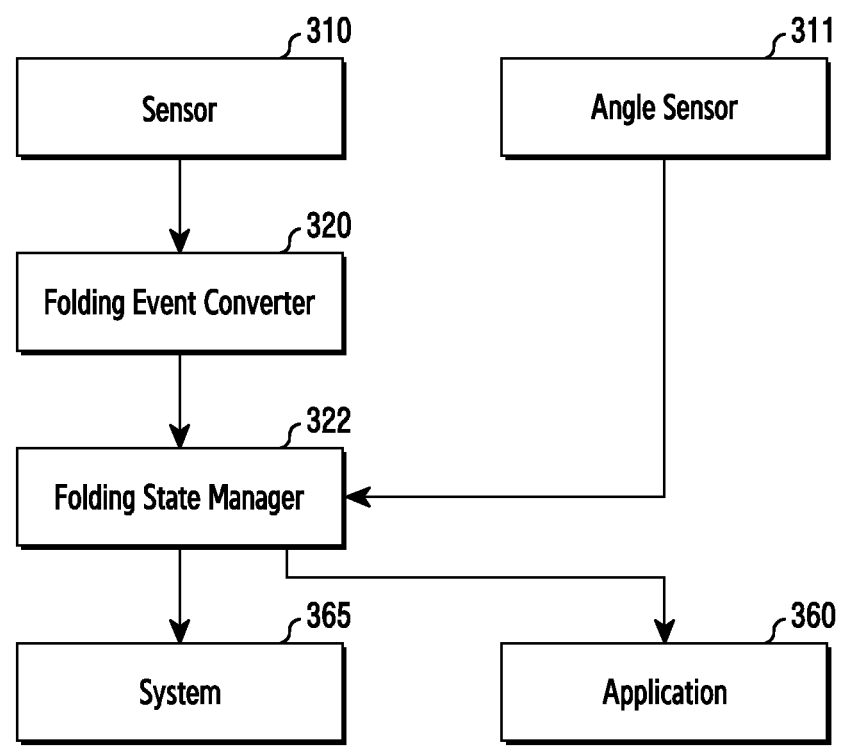

Referring to FIG. 4B, the folding state manager 322 may forward the folding state/event to the system 365 or the application 360 directly without via an folding event handler 328. For example, the folding state manager 322 may determine whether/where to forward the folding state based on the context information of the electronic device, which is acquired from the context manager 334.

Figure 4C:
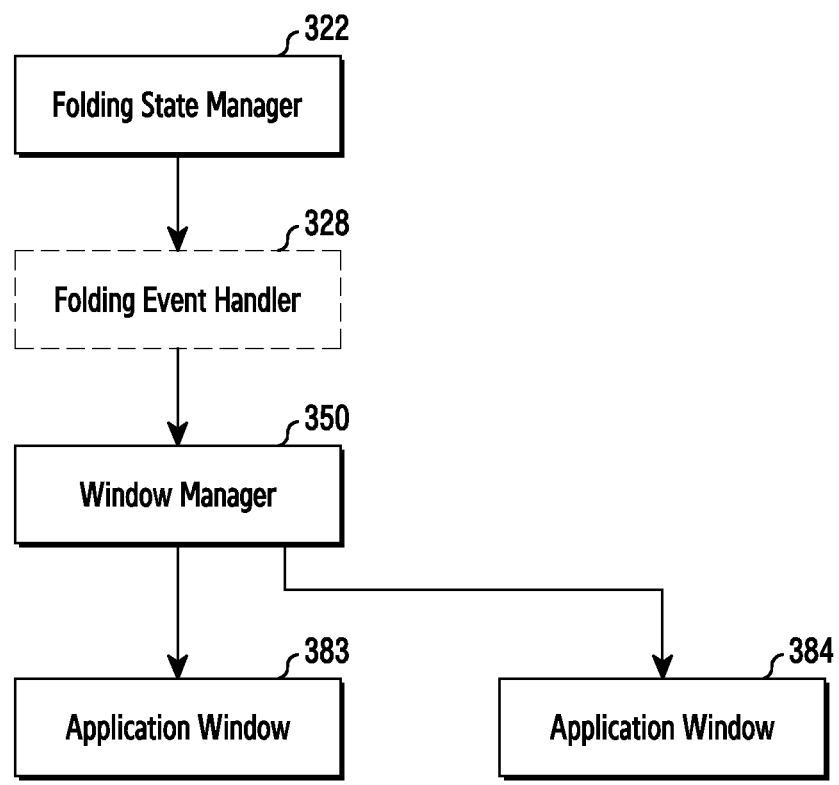

Referring to FIG. 4C, when only the screen of the display 261 (e.g., touch screen) is divided into a plurality of regions without virtually dividing the display 261 (see FIG. 5A or FIG. 5B) among screen division methods, since the coordinates on the display for the same point vary depending on the position of the application window 383 (or 260$b$1) (see FIG. 5B) or 384 (or 260$b$2) (see FIG. 5B), the window manager 350 may adjust the application windows 383 and 384 to correspond to the divided regions.

Figure 4D:
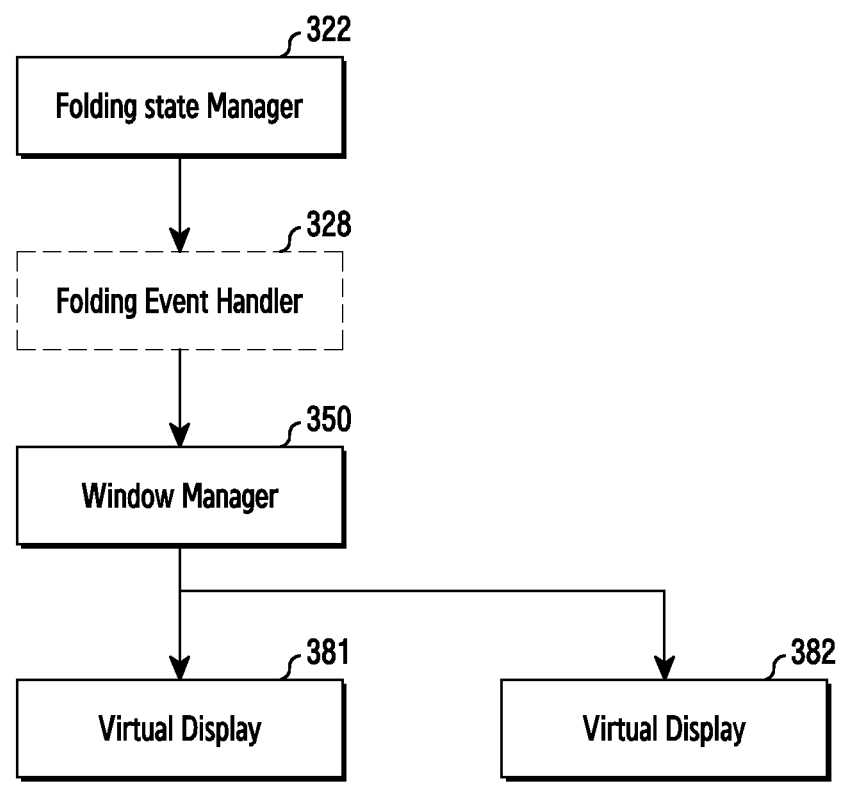

Referring to FIG. 4D, when a display is divided into a plurality of virtual displays 381 and 382 among the screen division methods, the plurality of the virtual displays 381 and 382 correspond to a plurality of application windows 383 (or 260$b$1) (see FIG. 5B) and 384 (or 260$b$2) (see FIG. 5B) in an one-to-one relation, and even if the positions of the application window 383 (or 260$b$1) (see FIG. 5B) and 384 (or 260$b$2) (see FIG. 5B) are different from each other, the coordinates on a corresponding display for the same point on an application window are the same. Thus, the window manager 350 may adjust the virtual displays 381 and 382 to correspond to the divided regions.

Figure 5A:
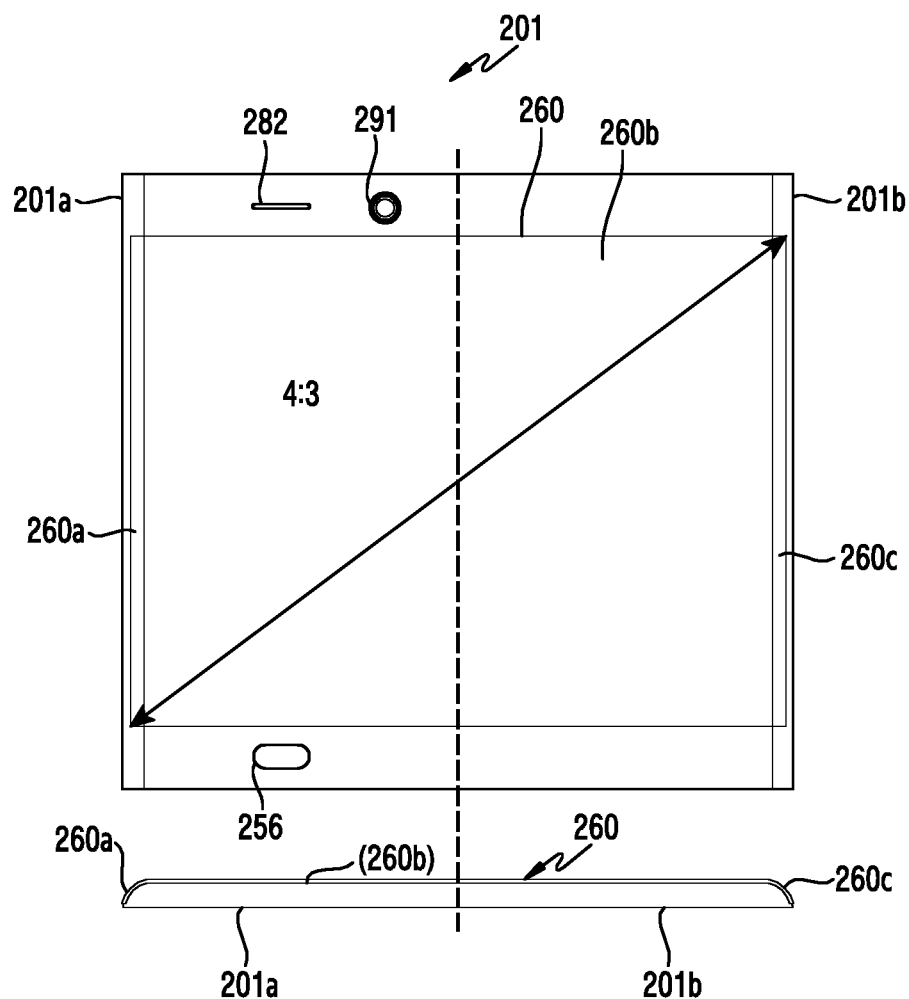
FIGS. 5A and 5B are diagrams illustrating an example electronic device according to an example embodiment of the present disclosure.
Figure 5B:
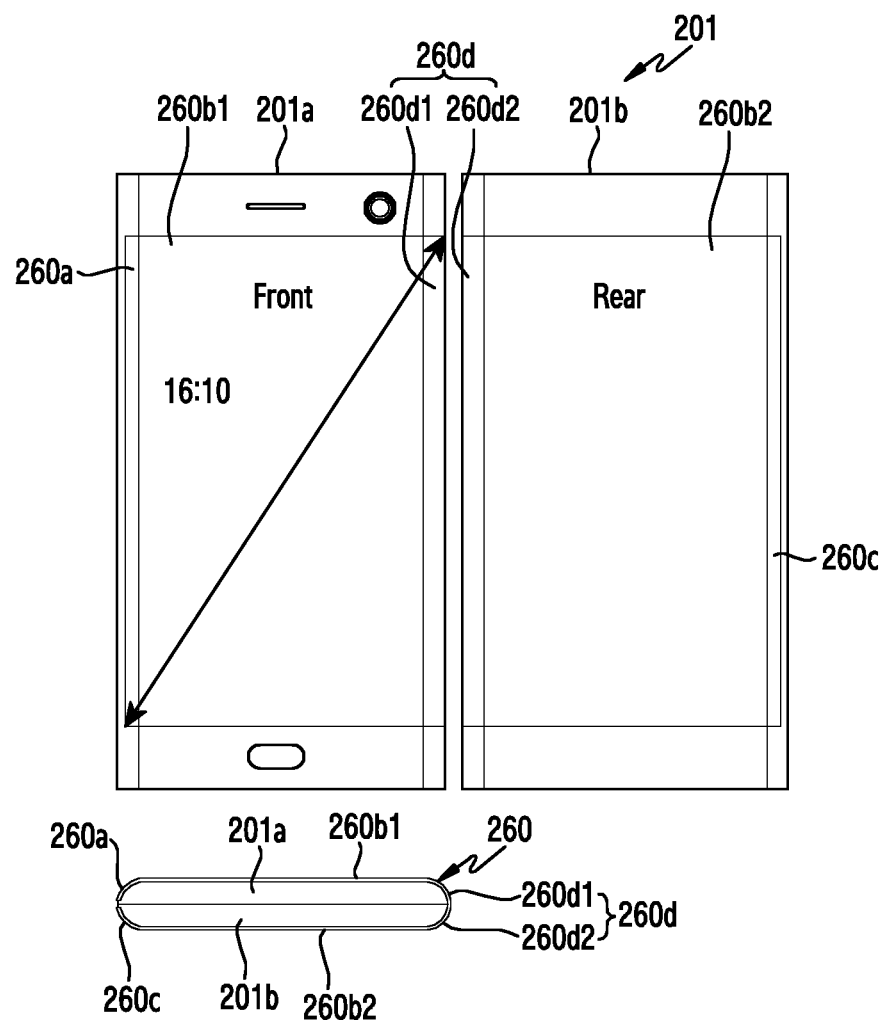

FIGS. 5A and 5B are diagrams illustrating an example electronic device according to an example embodiment of the present disclosure.

Figure 6A:
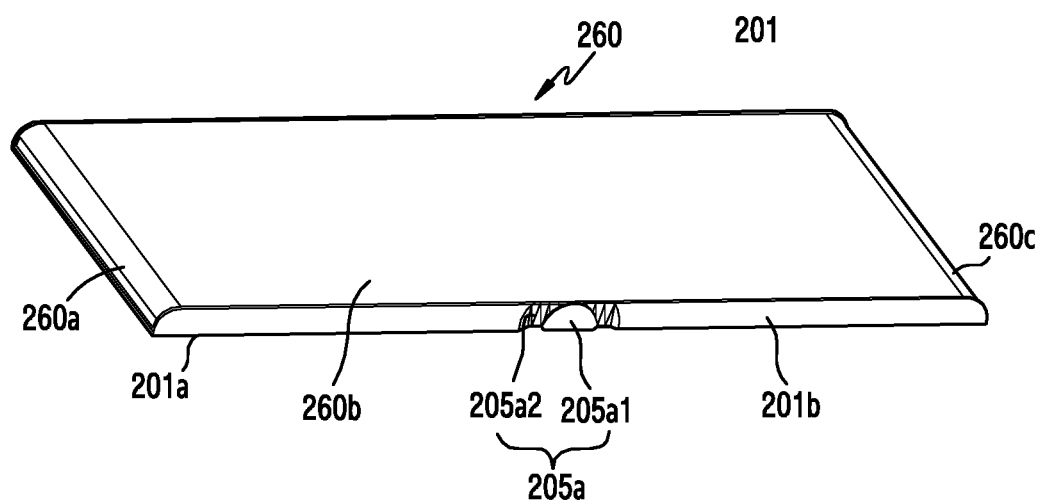
FIGS. 6A and 6B are a perspective view and a cross-sectional view, respectively, illustrating an example electronic device in an unfolded state according to an example embodiment of the present disclosure.
Figure 6B:
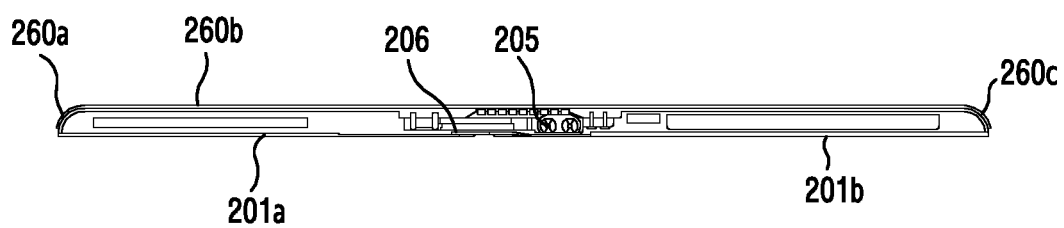

FIGS. 6A and 6B are a perspective view and a cross-sectional view, respectively, illustrating an example electronic device in an unfolded state according to an example embodiment of the present disclosure.

Figure 7A:
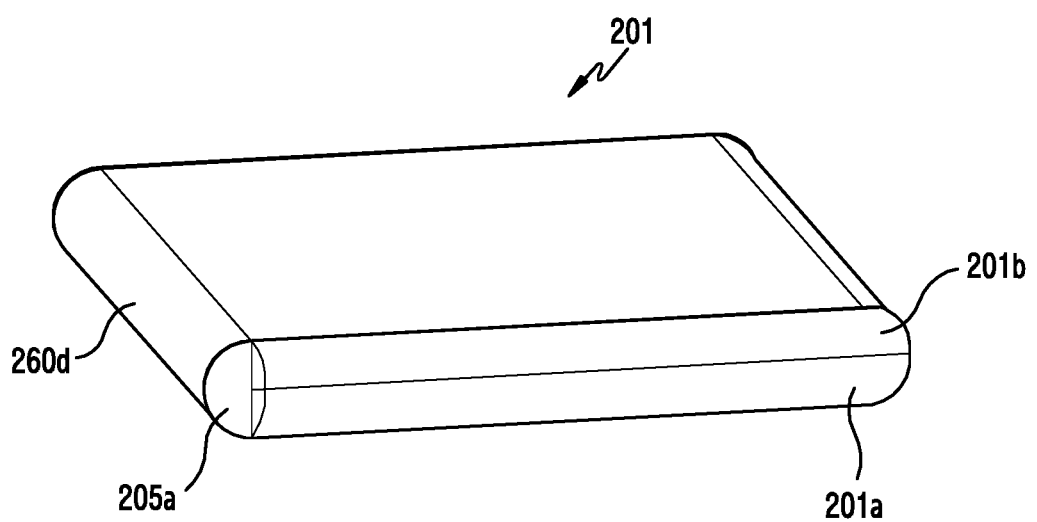
FIGS. 7A and 7B are a perspective view and a cross-sectional view, respectively, illustrating an electronic device in a folded state according to an example embodiment of the present disclosure.
Figure 7B:
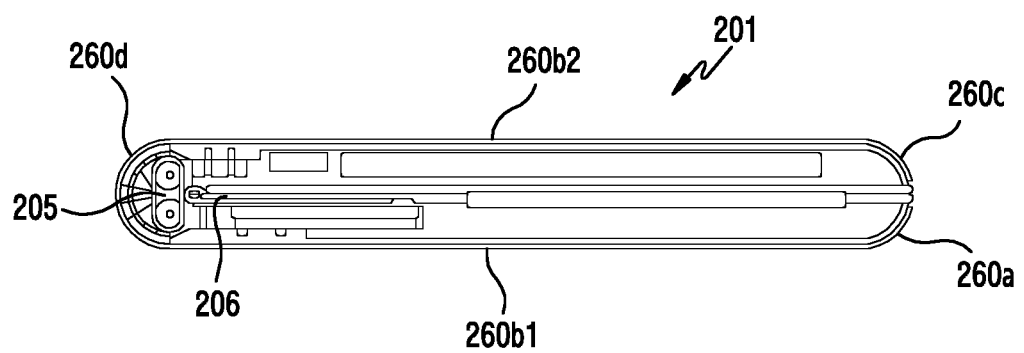

FIGS. 7A and 7B are a perspective view and a cross-sectional view, respectively, illustrating an example electronic device in a folded state according to an example embodiment of the present disclosure.

Referring to FIGS. 5A, 5B, 6A, 6B, 7A and 7B, an unfolded electronic device and an out-folded (folded or closed) electronic device 201 may be represented. The electronic device 201 has a first housing 201$a$ and a second housing 201$b$, side faces of which are connected to each other by a hinge 205 (see FIG. 6B) or by a flexible plastic. One flexible touch screen (or one flexible display) 260 (e.g., display 261, or display 160) may be positioned in the central region of the top face of the first housing 201$a$ and the central region of the top face of the second housing 201$b$ in the unfolded state. One half of the one flexible touch screen 260 may be positioned in the central region of the top face of the first housing 201$a$.

A camera 291 for capturing a still image or a video image, a proximity sensor 240G (FIG. 2) for detecting the approach of a user or an object, and a speaker 282 for outputting a voice and/or sound to the outside may be located in the upper portion of the top face of the first housing 201a. At least one portion of the flexible touch screen 260 may be positioned in the central portion of the top face of the first housing 201a, and a key (or a button) (e.g., a home button 256) may be positioned in the lower portion of the top face of the first housing 201a.

The remaining portion of the one (flexible) touch screen 260 may be positioned in the central region of the top face of the second housing 201b. An additional camera (not illustrated) for capturing a still image or a video image, and an additional speaker (not illustrated) for outputting a voice and/or sound to the outside of the electronic device 201 may be positioned in the upper portion of the top face of the second housing 201b. An additional key (or a button (not illustrated)) may be located in the lower portion of the top face of the second housing 201b).

Keys located in the lower end of the first housing 201a and keys located in the lower end of the second housing 201b may be implemented not only with physical keys, but also with touch keys. In addition, the keys located in the lower end of the first housing 201a and the keys located in the lower end of the second housing 201b may be implemented with a combination of physical keys and touch keys. Alternatively, no physical key (or button) may exist in the lower end of the top face of the electronic device 201.

A side face of each of the first housing 201a and the second housing 201b may be implemented as a curved face (e.g., a face including a single curvature (e.g., 5R (radius) or less), or multiple curvatures).

In FIG. 5A, the aspect ratio of the touch screen 260 in the electronic device 201 in the unfolded (opened) state may be 4:3 (or 4:3, 3:2, 8:5, 16:9, 16:10, 5:3, or 21:9, but is changeable). The resolution of the touch screen 260 in the electronic device 201 in the unfolded (opened) state may be 2048×1536 pixels. The above-described resolution may be changed depending on the size of the touch screen 260.

Touch screen 260 may include a reinforced (or chemically reinforced) glass so as to enable the folding thereof. The reinforced glass may be a single glass (e.g., a glass coated with a transparent plastic material of less than 100 microns and then coated with a hard coat layer thereon) or multiple glasses (e.g., two glasses bonded to each other with an adhesive). The thickness of the glass may be less than 100 μm.

One touch screen 260 in the unfolded electronic device 201 includes three regions (e.g., the left curved region (or the left curved display region) 260a of the first housing 201a, a flat region 260b (or the flat display region 260b), and the right curved region (or the right curved display region) 260c of the second housing 201b.

In FIG. 5B, the aspect ratio of the touch screen 260 displayed on the top face of the first housing 201a in the folded (closed) electronic device 201 is 16:10 (or 8:5, 16:9, or 21:9, but is changeable). The resolution of the touch screen 260 in the folded (out-folded) electronic device 201 may be 960×1536 pixels. The above-described resolution may be changed depending on the size of the touch screen 260.

The touch screen 260 of the out-folded (folded) electronic device 201 does not slide. The touch screen 260 of the opened (unfolded) electronic device 201 does not slide as well.

In the folded electronic device 201, one touch screen 260 may be divided into five regions (e.g., the left curved region (or the left curved display region) 260a of the first housing 201a, a first flat region (or a first flat display region) 260b1, a common curved region (or a common curved display region) 260d, a second flat region (or a second flat display region) 260b2, and the right curved region (or the right curved display region) 260c of the second housing 201b.

A common curved region (or a common curved display region) 260d appearing (or formed) in the central area of the flat region of the touch screen 260 by the folded (closed, out-folded) is a region continued to the other four regions. For the description of the embodiment, the common curved region may be divided into a right common curved region (or a right common curved display region) 260d1 of the first housing 201a, and a right common curved region (or the left common curved display region 260d2 of the second housing 201b) 260d2 of the second housing 201b. The common curved region 260d may be divided into right common curved region 260d1 and left common curved region 260d2 depending on the state of the electronic device 201 (for example, the folded state or the opened state).

Figure 15:
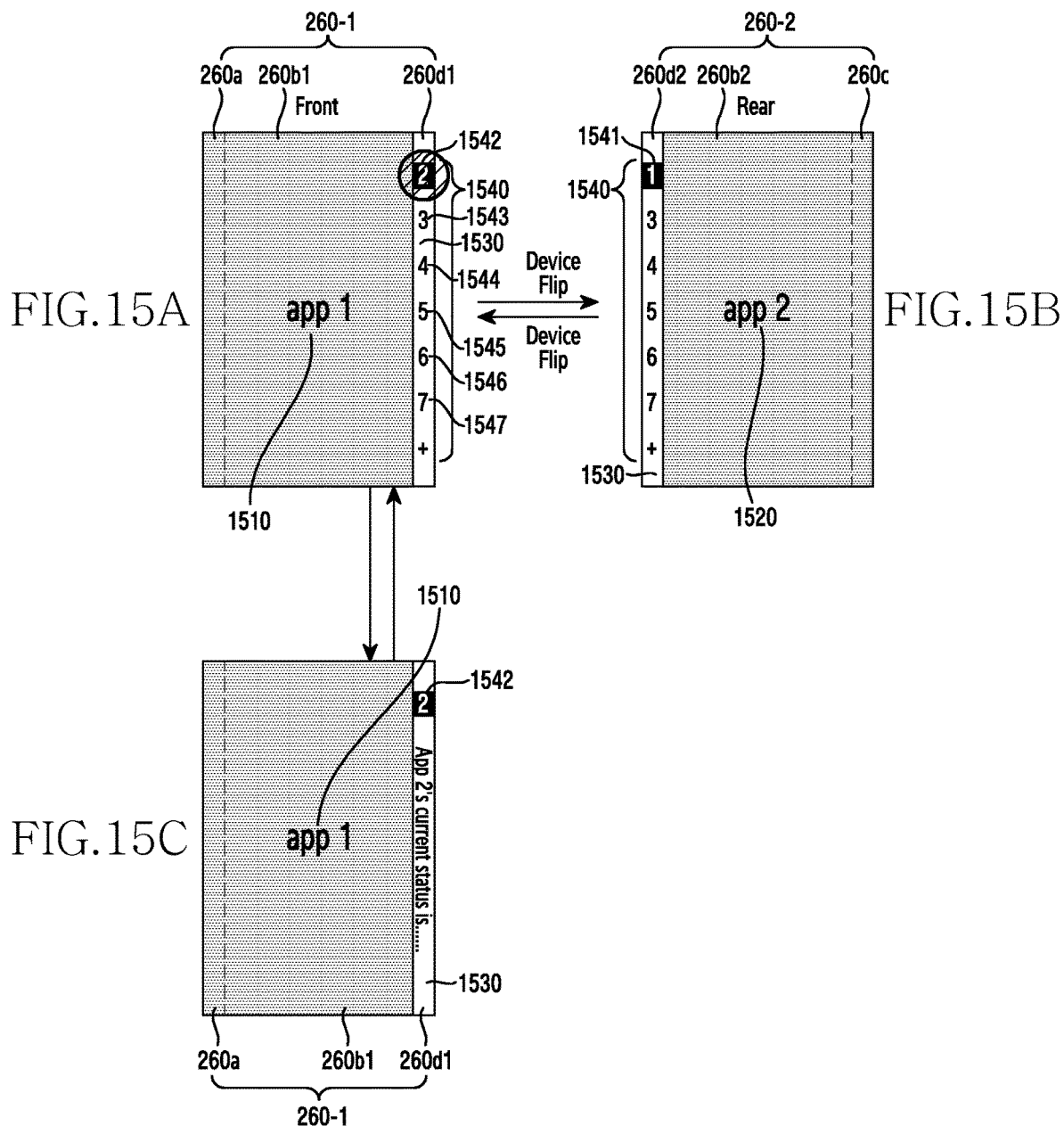
FIGS. 15A, 15B and 15C are diagrams illustrating an example control method of an example electronic device according to an example embodiment of the present disclosure.

In the folded electronic device 201, the touch screen 260 may be divided into a first screen 260-1 (see FIG. 15A to 15C) and a second screen 260-2 (see FIG. 15A to 15C). The first screen 260-1 may include a left curved region 260a, a first flat region 260b1, and a right common curved region 260d1 of the first housing (e.g., the first housing 201a of FIG. 5A or FIG. 5B). The second screen 260-2 may include a left common curved region 260d2, a second flat region 260b2, and a right curved region 260d1 of the second housing (e.g., the second housing 201b of FIG. 5A or FIG. 5B).

The area of the left curved region 260a and the area of the right curved region 260c may be equal to or different from each other (with a tolerance within a range of ±10%). The area of the right common curved region 260d1 is larger than the area of the left curved region 260a. The area of the left common curved region 260d2 is larger than the area of the right curved region 260c.

The area of the right common curved region 260d1 may be equal to or different from the area of the left curved region 260a (with a tolerance in the range of ±10%). The area of the right common curved region 260d1 may be equal to or different from the area of the right curved region 260c (with a tolerance in the range of ±10%). The area of the left common curved region 260d2 may be the same as or different from the area of the left curved region 260a (with a tolerance in the range of ±10%). The area of the left common curved region 260d2 may be equal to or different from the area of the right curved region 260c (with a tolerance in the range of ±10%).

The number of curved regions of the first screen 260-1 in the folded electronic device 201 may be two (e.g., 260a and 260d1). The number of curved regions of the second screen 260-2 in the folded electronic device 201 may be two (e.g., 260d2 and 260c). The number of curved regions of the touch screen 260 in the opened electronic device 201 may be two (260a and 260c).

Referring to FIGS. 6A and 6B, an unfolded (or opened) electronic device 201 may be represented. An electronic device 201, which is not be provided with a physical key (or a button) in the lower end of the top face thereof, may be represented. The electronic device 201, which is provided with a physical key 256 in the lower end of the top face of the first housing 201a (e.g., see FIG. 5A or FIG. 5B), may be represented.

The first housing 201a and the second housing 201b may be connected by a hinge 205. The hinge 205 may include, for example, a biaxial hinge. The hinge 205 may be covered by the hinge cover 205a. The hinge 205 may be covered by a semicircular hinge cover 205a1 and a fan-shaped hinge cover 205a2. The hinge 205 located inside the first housing 201a and the second housing 201b may not be exposed to the outside by the hinge cover 205a. The shape and structure of the hinge cover 205a may be modified according to various embodiments.

A slide cover 206 may be positioned in the lower ends of the first housing 201a and the second housing 201b. The slide cover 206 may be made of a flexible material. The slide cover 206 may cover a part of the bottom face of the first housing 201a and a part of the bottom face of the second housing 201b. One side of the slide cover 206 may be fixed to at least one of the first housing 201a and the second housing 201b. The other side of the slide cover 206 may be fixed to another housing. The touch screen 260 may be positioned on the top face of the first housing 201a and the top face of the second housing 201b.

Referring to FIGS. 7A and 7B, the electronic device 201, which is out-folded (or folded) by the hinge 205, may be represented.

The bottom face of the first housing 201a and the bottom face of the second housing 201b of the out-folded (or folded) electronic device 201 may be in contact each other. A part of the bottom face of the first housing 201a and a part of the bottom face of the second housing 201b in the electronic device 201 out-folded (or folded) by the hinge 205 are in contact with each other, and a part of the bottom face of the first housing 201a and a part of the bottom face of the second housing 201b may be spaced apart from each other (for example, by 1.5 mm or less, but is changeable).

The curvature (for example, R1) of the common curved region 260d may correspond to the curvature (e.g., R2) of the hinge cover 205a (e.g., the difference between R1 and R2 is about 25% or less of R1, but is changeable). For example, the curvature R1 of the common curved region 260d may correspond to the curvature R2 of the semicircular hinge cover 205a1 (e.g., the difference between R1 and R2 is 25% or less of R1, but is changeable).

A part of the slide cover 206 may be folded to correspond to the electronic device 201 out-folded (or folded) by the hinge 205. A part of the slide cover 206 (e.g., a region adjacent to the hinge 205) may be folded according to the electronic device 201 out-folded (or folded) by the hinge 205.

The left curved region 260a of the first screen 260-1 and the right curved region 260c of the second screen 260-2 in the folded electronic device 201 may be regions discontinued by the first housing 201a and the second housing 201b. The right common curved region 260d1 of the first screen 260-1 and the left common curved region 260d2 of the second screen 260-2 in the folded electronic device 201 may be regions continued by the hinge 205 (or link).

Figure 8:
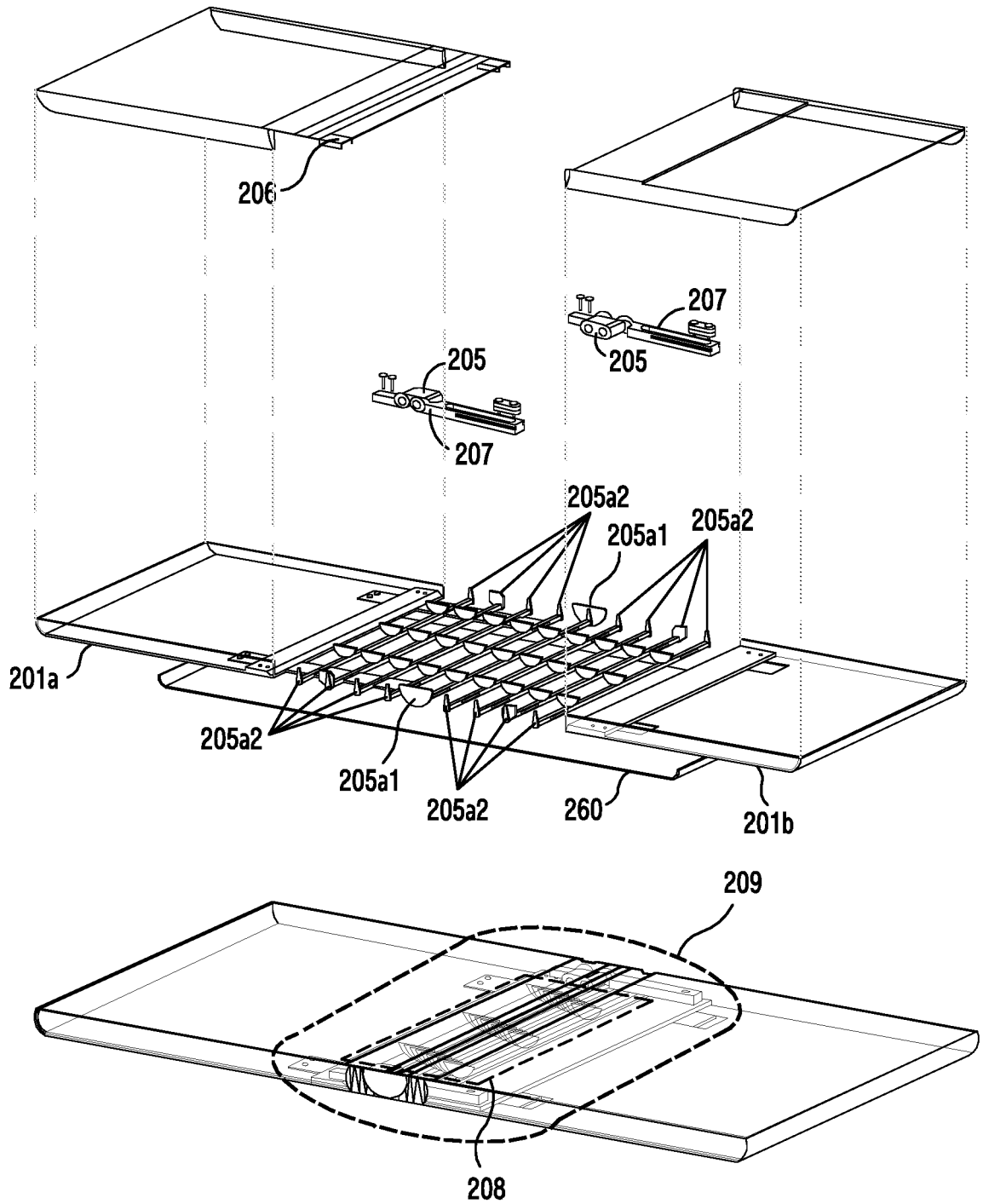
FIG. 8 is an exploded perspective view illustrating an example connection structure of an example electronic device according to an example embodiment of the present disclosure.

FIG. 8 is an exploded perspective view illustrating an example electronic device according to an example embodiment of the present disclosure.

Figure 9:
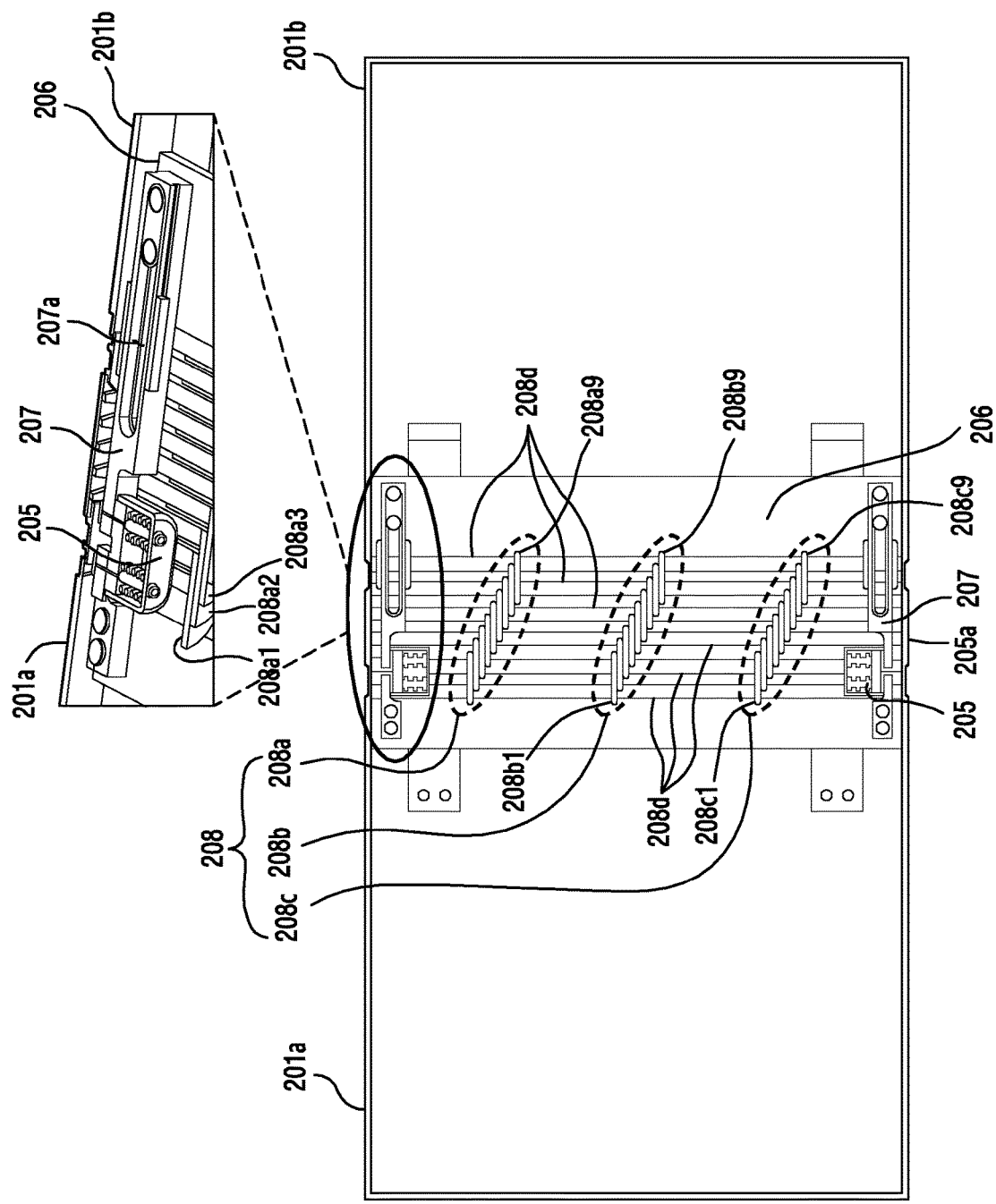
FIG. 9 is a diagram illustrating an example connection structure of a hinge and a cover sheet of an example electronic device according to an example embodiment of the present disclosure.

FIG. 9 is a diagram illustrating an example connection structure of a hinge and a cover sheet of an example electronic device according to an example embodiment of the present disclosure.

Figure 10A:
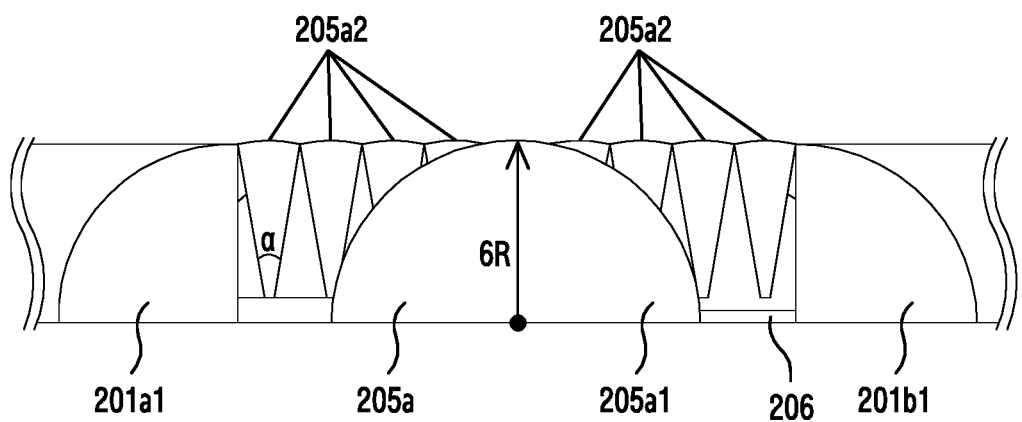
FIGS. 10A and 10B are diagrams illustrating an example hinge cover of an example electronic device according to an example embodiment of the present disclosure.
Figure 10B:
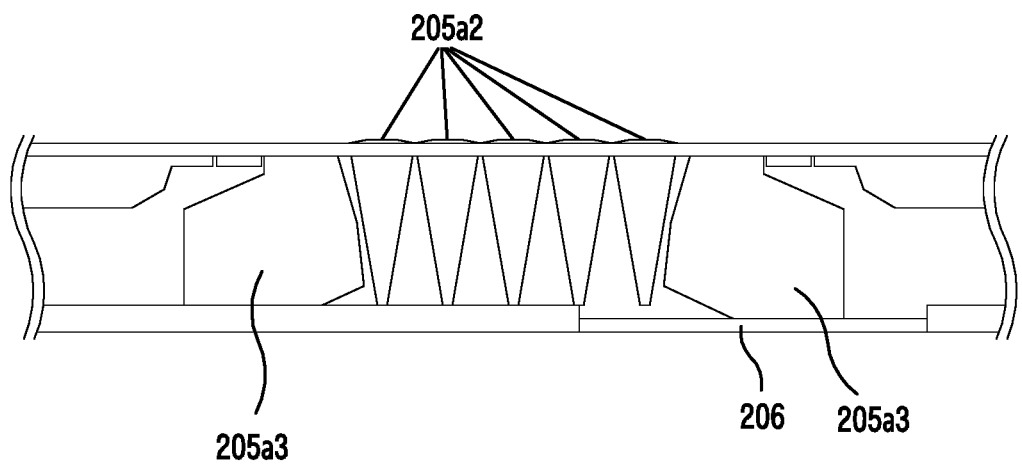

FIGS. 10A and 10B are diagrams illustrating an example hinge cover of an example electronic device according to an example embodiment of the present disclosure.

Figure 11A:
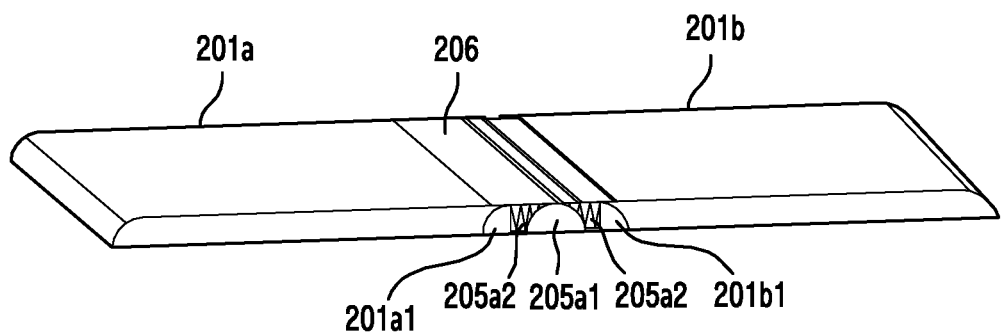
FIGS. 11A and 11B are diagrams illustrating an example slide cover of an example electronic device according to an example embodiment of the present disclosure.
Figure 11B:
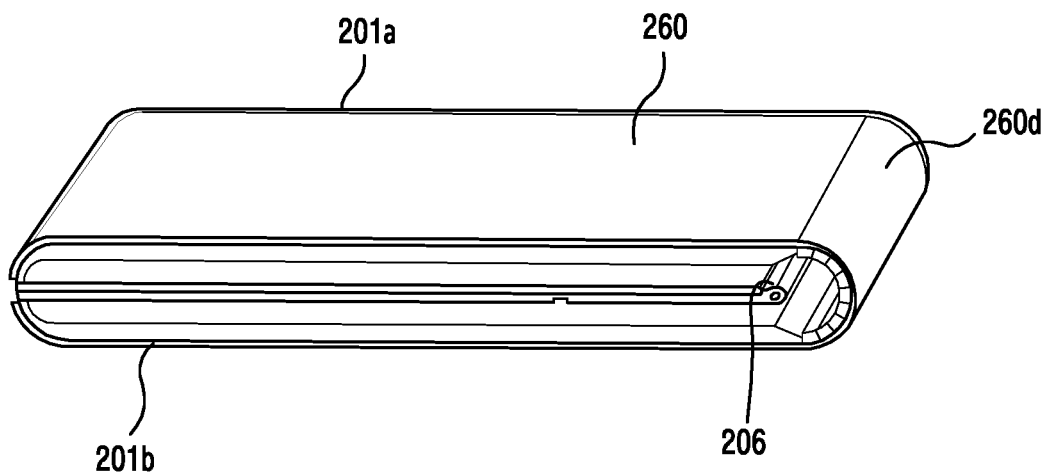

FIGS. 11A and 11B are diagrams illustrating an example slide cover of an example electronic device according to an example embodiment of the present disclosure.

Figure 12A:
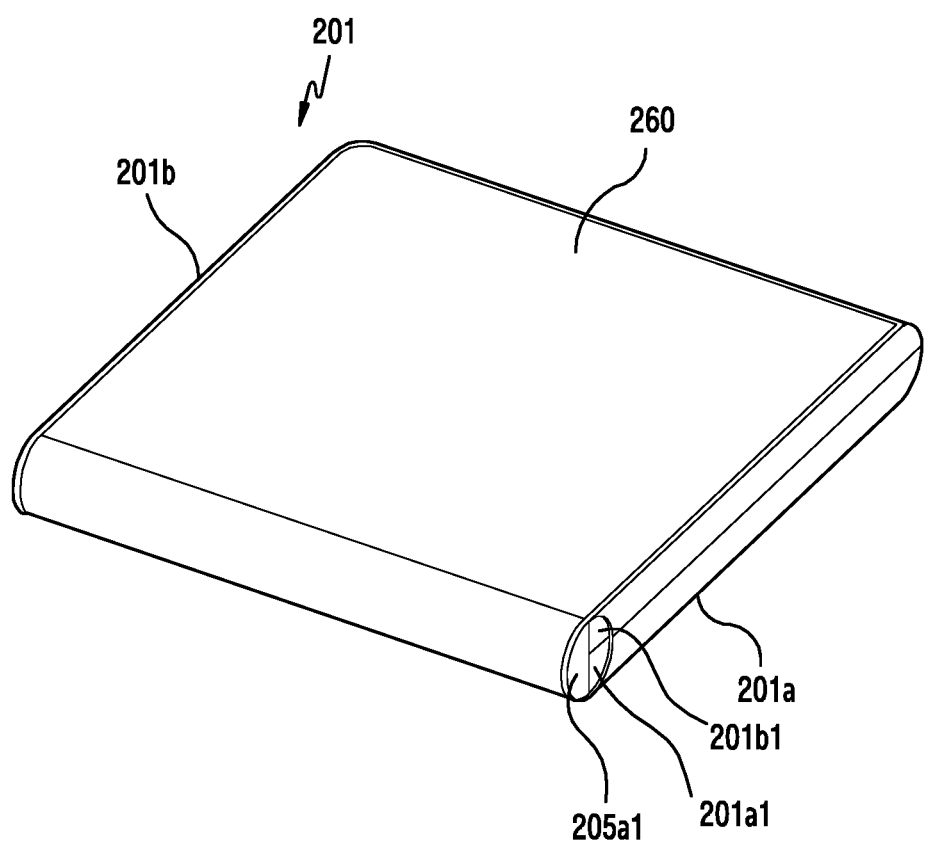
FIGS. 12A and 12B are diagrams illustrating an example hinge cover of an example electronic device according to various example embodiments of the present disclosure.
Figure 12B:
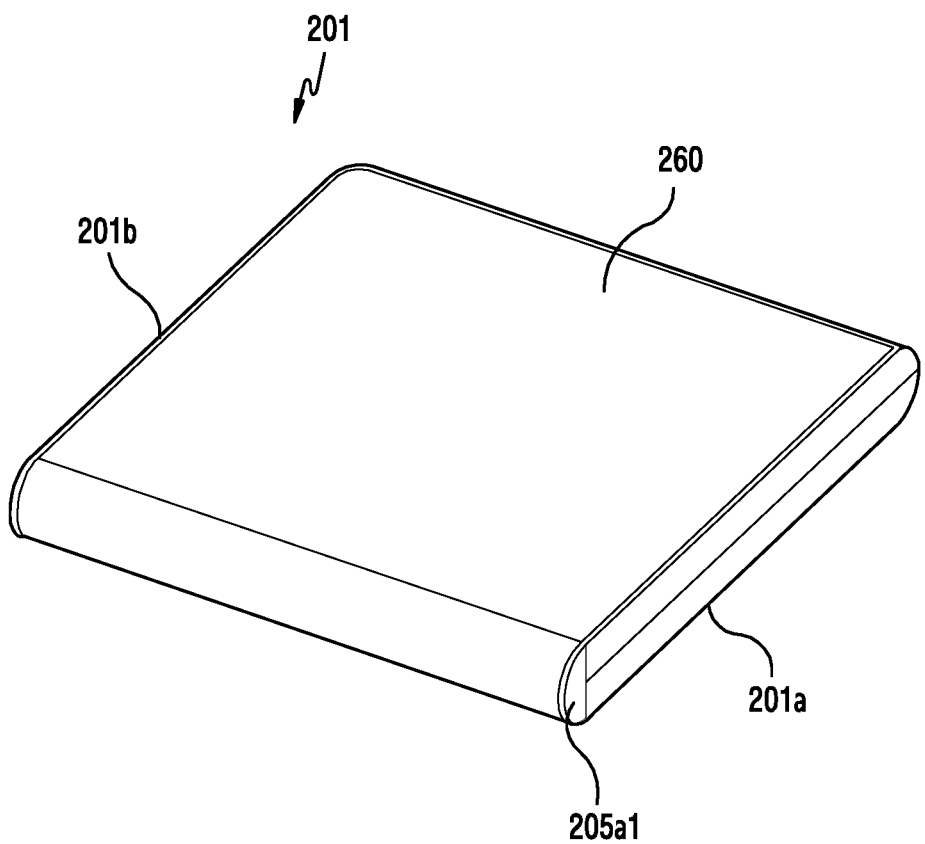

FIGS. 12A and 12B are diagrams illustrating an example hinge cover of an example electronic device according to various example embodiments of the present disclosure.

Figure 13A:
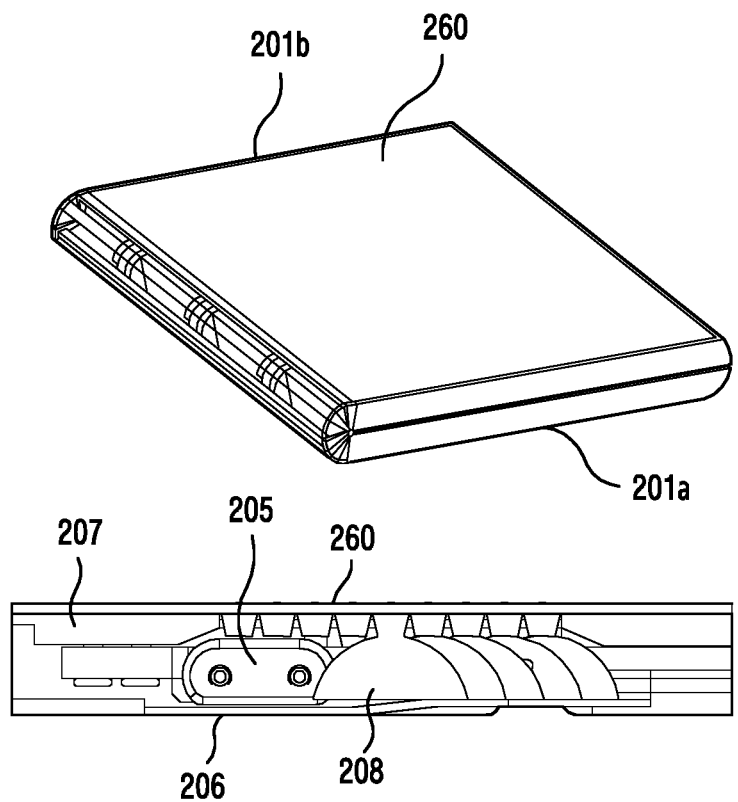
FIGS. 13A and 13B are diagrams illustrating an example support sheet member of an example electronic device according to various example embodiments of the present disclosure.
Figure 13B:
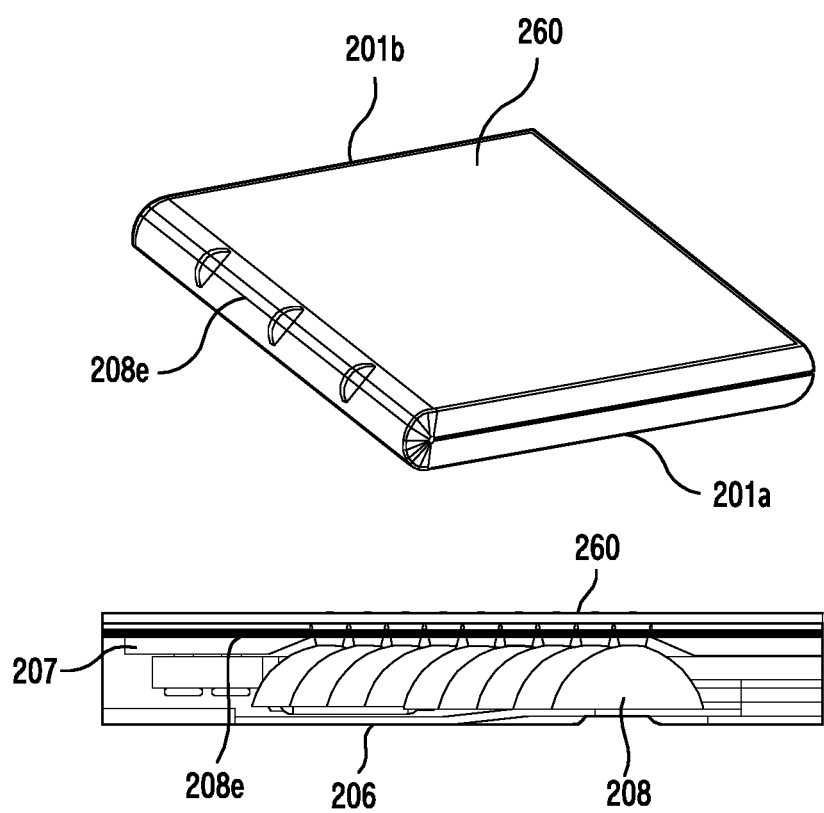

FIGS. 13A and 13B are diagrams illustrating an example support sheet member of an example electronic device according to various example embodiments of the present disclosure.

Referring to FIGS. 8, 9, 10A, 10B, 11A and 11B, an exploded perspective view of a connection structure (or the connection and cover structure) (hereinafter, referred to as a "connection structure") of the electronic device 201 may be understood.

The unfolded electronic device 201 in FIGS. 8 and 9 is illustrated in an upside-down state for the description of a connection structure 209. The first housing 201a and the second housing 201b may be connected by the connection structure 209. In addition, the inside of the first housing 201a and the inside of the second housing 201b may not be exposed to the outside due to the connection structure 209.

A flexible touch screen 260 may be positioned on the top faces of the inverted first housing 201a and the inverted second housing 201b. The connection structure may be located below (or partially on a side of) the flexible touch screen 260. The connection structure 209 may include a hinge 205, a hinge cover 205a, a slide cover 206, a cover guide rail 207, a plurality of support sheets 208, and a plurality of bars (or rods) 208d. In the connection structure 209, at least one of the hinge 205, the hinge cover 205a, the slide cover 206, the cover guide rail 207, the plurality of support sheets 208, and the plurality of bars (or rods) 208d may be omitted. For example, the hinge cover 205a may be omitted from the connection structure 209. The slide cover 206 may be omitted from the connection structure 209.

The hinge 205 may be a biaxial hinge that connects the first housing 201a and the second housing 201b to each other. The hinge 205 may be a biaxial click hinge. A part of the hinge 205 may not be exposed to the outside of the electronic device 201 unfolded by the hinge (or an equivalent) 205. The inside of the biaxial hinge 205 may include a cam (not illustrated) and a spring (not illustrated). The inside of the biaxial hinge 205 may include a cam (not illustrated), a spring (not illustrated), and a stopper (not illustrated).

At least one of the first housing 201a and the second housing 201b of the electronic device 201 unfolded by the cam (not illustrated) and the spring (not illustrated) of the biaxial hinge 205 may be rotate in a direction in which the first housing 201a and the second housing 201b face each other. At least one of the first housing 201a and the second housing 201b of the electronic device 201 unfolded by the cam (not illustrated), the spring (not illustrated), and the stopper (not illustrated) of the biaxial hinge 205 may be rotate in a direction in which the first housing 201a and the second housing 201b face each other.

When the rotation angle of at least one of the first housing 201a and the second housing 201b of the unfolded electronic device 201 is 0° (or ±5° or less, but is changeable), 90° (or ±5° or less, but changeable), or a set angle (e.g., 45°, but is changeable by setting), at least one of the first housing 201a and the second housing 201b is auto-locked. The set angle may include 0°, 90°, or an arbitrary angle.

The hinge 205 may comprise a biaxial free-stop hinge.

Referring to FIGS. 8 to 12B, the hinge cover 205a may prevent and/or reduce the hinge 205 from being exposed to the outside in the axial direction. The number of the hinge covers 205a may correspond to the number of the hinges 205. For example, two hinge covers 205a may be implemented on the two hinges 205.

The hinge covers 205a may include semicircular hinge covers 205a1 and fan-shaped hinge covers 205a2 (see FIGS. 10A and 10B and FIGS. 11A and 11B). The semicircular hinge covers 205a1 may be located at the outermost position in a separate hinge 205, and the fan-shaped hinge covers (e.g., α=20°, but a is changeable depending on the number of the hinge covers) are provided between the hinge 205 and the semicircular hinge cover 205a1. The radius of the semicircular hinge covers 205a1 may be 6 mm (the curvature is 6R). In addition, the diameter of the semicircular hinge cover 205a1 may be 2.5 mm or more and less than 10 mm.

When the unfolded electronic device 201 is folded, the fan-shaped hinge covers 205a2 located between the semicircular hinge cover 205a1 and the hinge 205 may be gathered so as to form a semicircular shape. When the unfolded electronic device 201 is folded, the fan-shaped hinge covers 205a2 located between the semicircular hinge cover 205a1 and the hinge 205 may be gathered so as to be covered by the semicircular hinge cover 205a1 (e.g., the gathered fan-shaped hinge covers form a semicircular shape).

The hinge cover 205a may include fan-shaped hinge covers 205a2 and free-type hinge covers 205a3 (see FIGS. 10A and 10B). The free-type hinge cover 205a3 is positioned at the outermost position in the separate hinge 205 and the fan-shaped hinge covers 205a2 may be positioned between the hinge 205 and the semicircular hinge cover 205a1.

When the unfolded electronic device 201 is folded, the fan-shaped hinge covers 205a2 located between the free-type hinge cover 205a3 and the hinge 205 may be gathered. When the unfolded electronic device 201 is folded, the fan-shaped hinge covers 205a2 located between the free-type hinge cover 205a3 and the hinge 205 may be gathered so as to be covered by the free-type hinge cover 205a3.

It is sufficient if each of the hinge covers 205a has a shape suitable for preventing the axial exposure of the hinge 205 (e.g., a semicircular shape, a fan shape, a free shape, or an indefinite shape).

Referring to FIG. 11A and FIG. 12A, recesses 201a1 and 201b1 corresponding to the hinge cover 205a may be formed in the first housing 201a and the second housing 201b. Each of the recesses 201a1 and 201b1 may have a quarter-circular (quadrant) shape. The region outside the hinge of the folded electronic device 201 may be represented in a circular shape (see FIG. 12A) by the semicircular hinge cover 205a1 and the recesses 201a1 and 201b1.

Referring to FIG. 8 to FIG. 11B, a slide cover 206 may cover the hinge 205, a part (or portion) of the cover guide rail 207, and a support sheet 208 so as not to be exposed to the outside (e.g., the bottom face or a side face of the housing). The slide cover 206 may cover the hinge 205, a part (or portion) of the cover guide rail 207, the support sheet 208, and a plurality of bars 208d so as not to be exposed to the outside (e.g., the bottom face or a side face of the housing).

One end of the slide cover 206 may be fixed to the cover guide rail 207 located in at least one of the first housing 201a and the second housing 201b. One end of the slide cover 206 may be fixed to at least one of the first housing 201a and the second housing 201b. It is sufficient if the slide cover 206 is made of a flexible material. It may be sufficient if the slide cover 206 is made of an opaque material.

In FIGS. 11A and 11B, the slide cover 206 may be unfolded in the unfolded electronic device 201. The slide cover 206 may be folded (or superimposed) in the folded electronic device 201.

Referring to FIGS. 8 and 9, the cover guide rail 207 may fix one end of the slide cover 206. One end of the cover guide rail 207 may be connected to the rotation shaft of the hinge 205. The other end of the cover guide rail 207 may be fixed to one of the first housing 201a and the second housing 201b.

One end of the slide cover 206 may move along the groove 207a of the cover guide rail 207 according to the unfolding or folding of the electronic device 201.

Referring to FIGS. 8, 9, 13A, and 13B, the support sheet 208 may support the touch screen 260. The support sheet 208 may support the touch screen 260 under the touch screen 260 in response to the user's touch input. The support sheet 208 may be implemented as a plurality of groups 208a, 208b, 208c or a single group (not shown). Descriptions will be made with reference to the plurality of groups 208a, 208b, and 208c. The plurality of groups 208a, 208b, and 208c are grouped for explanation purpose, and may be described as a single group.

Each of the plurality of groups 208a, 208b, 208c may include a plurality of (e.g., nine) semicircular support sheet members (the number of the support sheet members is variable). The thickness of the support sheet members may be thinner than or equal to the thickness of the hinge cover 205a.

The plurality of support sheet members 208a1, 208a2, . . . , and 208c9 in each of the plurality of groups 208a, 208b, and 208c are also movable as the electronic device 201 is unfolded or folded.

One end of each of the support sheet members 208a1, 208a2, . . . , and 208c9 in each of the plurality of groups 208a, 208b, and 208c may be connected to one of a plurality of bars 208d positioned side by side in the axial direction of the hinge 205.

One end of one of the plurality of bars 208d may be connected to one hinge cover 205a. The other end of one of the plurality of bars 208d may be connected to the opposite hinge cover 205a. One end of one of the plurality of bars 208d may be connected to one semicircular hinge cover 205a1. The other end of one of the plurality of bars 208d may be connected to the opposite semicircular hinge cover 205a1. One end of one bar of the plurality of bars 208d may be connected to one fan-shaped hinge cover 205a2. The other end of one of the plurality of bars 208d may be connected to the opposite fan-shaped hinge cover 205a2.

The support sheet members 208a1, 208a2, . . . , and 208c9 are also movable following the plurality of bars 208d that move as the electronic device 201 is unfolded or folded.

One end of one of the plurality of bars 208d may be connected to one free-type hinge cover 205a3. The other end of one of the plurality of bars 208d may be connected to the opposite free-type hinge cover 205a3. One end of one bar of the plurality of bars 208d may be connected to one fan-shaped hinge cover 205a2. The other end of one of the plurality of bars 208d may be connected to the opposite fan-shaped hinge cover 205a2.

The support sheet members 208a1, 208a2, . . . , and 208c9 may support the touch screen 260 in a mutually crossing manner following the plurality of bars 208d that move as the electronic device 201 is unfolded or folded. In addition, the plurality of bars 208d may be connected to the hinge covers 205a. The plurality of bars 208d and the hinge covers 205a connected to the plurality of bars 208*d* may move (or rotate) in response to the folding of the electronic device 201.

The bars 208*e* may penetrate the support sheet members 208*a*1, 208*a*2, . . . , and 208*c*9 in the respective groups 208*a*, 208*b*, and 208*c*. The support sheet members 208*a*1, 208*a*2, . . . , and 208*c*9 in the respective groups 208*a*, 208*b*, and 208*c* may be aligned with each other by the bars 208*e*. There may be provided a single bar 208*e* or multiple bars 208*e*.

An electronic device according to an example embodiment includes: a first housing including a first face facing a first direction, and a second face facing a second direction opposite the first direction; a second housing including a third face facing a third direction, and a fourth face facing a fourth direction; a touch screen display continuously disposed between the first face of the first housing and the second face of the first housing and between the third face of the second housing and the fourth face of the second housing, the touch screen being exposed through the first face of the first housing and the third face of the second housing, the touch screen including a flat region and a plurality of curved regions; a hinge configured to connect the first housing and the second housing to each other; a hinge cover located outside the hinge; and a support sheet positioned under a common curved region of the touch screen, and disposed in a central region of the flat region corresponding to the touch screen display, the support sheet being configured to support the folded touch screen display under the common curved region.

In an example embodiment, the hinge includes biaxial hinge, and the biaxial hinge may include a biaxial click hinge or a biaxial free stop hinge.

In an example embodiment, when at least one of the first housing and the second housing reaches a set angle, at least one of the first housing and the second housing may be locked by the hinge.

In an example embodiment, the hinge cover may include a semicircular hinge cover and a fan-shaped hinge cover, or a fan-shaped hinge cover and a free-type hinge cover to prevent and/or reduce the hinge from being axially exposed.

In an example embodiment, when the electronic device is out-folded (folded), a part of the fan-shaped hinge cover may be covered by the semicircular hinge cover located outside the fan-shaped hinge cover.

In an example embodiment, when the electronic device is out-folded (folded), a part of the fan-shaped hinge cover may be covered by the free-type hinge cover located outside the fan-shaped hinge cover.

In an example embodiment, the electronic device may further include a flexible slide cover configured to cover a part of the second face of the first housing and a part of the fourth face of the second housing.

In an example embodiment, one end of the slide cover may be connected to a cover guide rail connected to a shaft of the hinge, and another end of the slide cover is connected to one of the first housing and the second housing.

In an example embodiment, one end of the slide cover may move along a recess of the cover guide rail.

In an example embodiment, the slide cover may also be folded to correspond to the electronic device when the electronic device is out-folded (folded).

In an example embodiment, the support sheet may include a single group which may include a plurality of semicircular support sheet members or a plurality of groups each including a plurality of semicircular support sheet members.

In an example embodiment, one end of one support sheet member of the plurality of support sheet members may be connected to one of a plurality of bars positioned in an axial direction of the hinge.

In an example embodiment, one end of one bar of the plurality of bars may be connected to the semicircular hinge cover of the hinge cover.

In an example embodiment, one end of one bar of the plurality of bars may be connected to the fan-shaped hinge cover of the hinge cover.

In an example embodiment, one end of one bar of the plurality of bars may be connected to the free-type hinge cover of the hinge cover.

In an example embodiment, a resolution of the touch screen display in an out-folded (folded) state and a resolution of the touch screen display in an opened state may differ from each other, In an example embodiment, the number of the curved regions in a first screen corresponding to the first face of the first housing among the out-folded (folded) touch screen displays may be equal to the number of the curved regions of the opened touch screen display.

In an example embodiment, a left curved region of a first screen corresponding to the first face of the first housing among the out-folded (folded) touch screen displays and a right curved region of a second screen corresponding to the third face of the second housing among the out-folded (folded) touch screen displays may be discontinuous.

In an example embodiment, a right common curved region of a first screen corresponding to the first face of the first housing among the out-folded (folded) touch screen displays and a left common curved region of a second screen corresponding to the third face of the second housing among the out-folded (folded) touch screen displays may be continuous.

In an example embodiment, no physical button may exist in a lower end of the touch screen display located in a central portion of a top face of the electronic device.

In an example embodiment, an electronic device includes: a first housing including a first face facing a first direction, and a second face facing a second direction opposite the first direction; a second housing including a third face facing a third direction, and a fourth face facing a fourth direction; a touch screen display continuously disposed between the first face of the first housing and the second face of the first housing and between the third face and the fourth face of the second housing, the touch screen being exposed through the first face of the first housing and the third face of the second housing, the touch screen including a flat region and a plurality of curved regions; a hinge configured to connect the first housing and the second housing, wherein the first housing is folded respect to the second housing using the hinge; and a support sheet positioned under a common curved region of the touch screen display, and formed in a central region of the flat region corresponding to the touch screen display, and configured to support a folded touch screen display under the common curved region.

Figure 14:
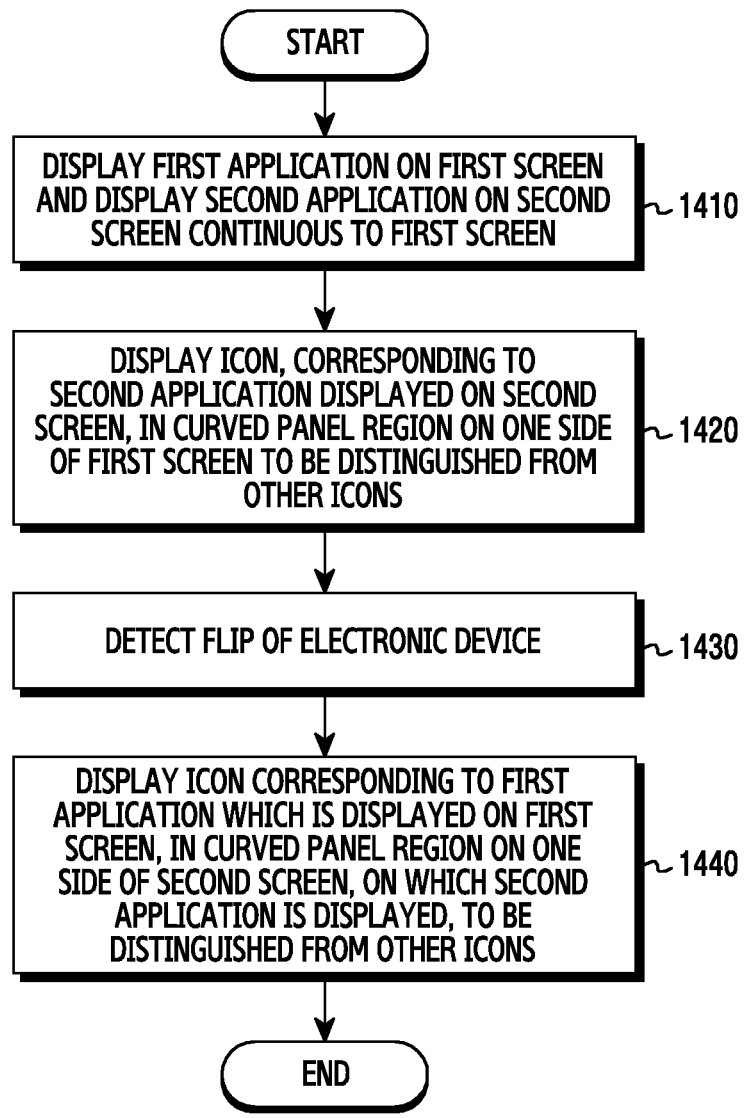
FIG. 14 is a flowchart illustrating an example control method of an electronic device according to an example embodiment of the present disclosure.

FIG. 14 is a flowchart illustrating an example control method of an example electronic device according to an example embodiment of the present disclosure.

FIGS. 15A, 15B and 15C are diagrams illustrating an example of a control method of an example electronic device according to an example embodiment of the present disclosure.

In step 1410 of FIG. 14, a first application (app 1) is displayed on a first screen of the electronic device, and a second application (app 2) is displayed on a second screen, which is continuous to the first screen.

Referring to FIG. 15A, the electronic device 201 displays a first application (app 1) 1510 on a first screen 260-1 and a second application (app 2) 1520 on a second screen 260-2, which is continuous to the first screen.

The first screen 260-1 of the electronic device 201 may refer, for example, to one of the first housing 201a and the second housing 201b. For example, when the screen of the second housing 201b is the first screen 260-1, the screen of the first housing 201a may be the second screen 260-2.

The first screen 260-1 may refer, for example, to a right common curved region 260d1 of the first housing 201a, a first flat region 260b1, and a left curved region 260a of the first housing 201a. In addition, the first screen 260-1 may include the left curved region 260a and the first flat region 260b1 of the first housing 201a. When the right common curved region 260d1 of the first housing 201a is a curved panel region, the first application 1510 may be displayed on the first screen (260a or 260b1).

The second screen 260-2 may refer, for example, to the left common curved region 260d2, a second flat region 260b2, and a right curved region 260c of the second housing 201b. In addition, the second screen 260-2 may include the right curved region 260c and the second flat region 260b2 of the second housing 201b. When the left common curved region 260d2 of the second housing 201b is a curved panel region, the second application 1520 may be displayed on the second screen (260b2 or 260c).

When the electronic device 201 is out-folded (folded), the second screen 260-2 of the electronic device 201 may be turned off.

In step 1420 of FIG. 14, an icon corresponding to the second application displayed on the second screen is displayed on the curved panel region located on one side of the first screen so as to be distinguished from the other icons.

Referring to FIG. 15A, a curved panel region 1540 may be represented on one side of the first screen 260-1 of the folded electronic device 201 (e.g., the left side or right side (not illustrated) of the first screen 260-1 as in of FIG. 15A). An icon (a text, or a symbol) 1540 of an executable (or registered) application may be displayed in the curved panel region 1530. The number of displayed icons 1540 may be changed depending on the number of executable applications.

An icon 1542, which corresponds to the second application 1520 displayed on the second screen 260-2 among the icons 1540 displayed in the curved panel region 1530 (as illustrated in FIG. 15C) of the first screen 260-1, may be displayed to be distinguished (e.g., by inversion, shading, or color change) from the other icons 1543 to 1547.

In step 1430 of FIG. 14, the flip of the electronic device is detected.

Referring to FIGS. 15A, 15B and 15C, the user may flip the electronic device 201. The electronic device 201 may calculate the flip (or folding) of the electronic device 201 using a sensor 310 (e.g., a strain sensor 312, a distance sensor 313, or a gyroscope sensor 314) or the like. Since the flip of the electronic device 201 has been described in detail with reference to FIGS. 3 to 4D, a redundant description is not repeated here.

In step 1440 of FIG. 14, an icon, which corresponds to the first application displayed on the first screen, is displayed in a curved panel region on one side of the second screen, on which the second application is displayed, to be distinguished from other icons.

Referring to FIG. 15B, when the electronic device 201 is flipped, the curved panel region 1530 may be displayed on one side 260d2 of the second screen 260-2 of the second housing 201b. The position of the curved panel region 1530 may also be changed (e.g., From 260d1 to 260d2) according to the flip of the electronic device 201. The icon 1540 displayed in the curved panel region 1530 may be changed by the flip of the electronic device 201.

An icon 1541, which corresponds to the first application 1510, may be displayed in the curved panel region 1530, which is displayed as the electronic device 201 is flipped. The icon 1541 displayed in the curved panel region 1530 may be displayed to distinguished (e.g., by inversion, shading, or color change) from other icons (e.g., icon 1543 to icon 1547). In addition, the icon 1542 corresponding to the second application 1520 may not be displayed.

Referring to FIGS. 15A, 15B and 15C, when a user input (e.g., a touch) is received in an icon displayed in the curved panel region 1530 of the first screen 260-1 (e.g., the icon 1542 corresponding to the second application), the electronic device 201 may display the current status of the second application 1520 in the curved panel region 1530. In addition, when a user input (e.g., a touch) is received in an icon (e.g., one of the icons 1542 to 1547) displayed in the curved panel region 1530, the electronic device 201 may display the current state of the application corresponding to the selected icon in the curved panel region 1530.

An icon (e.g., the icon 1541) displayed on the curved panel region 1530 of the second screen 260-2 may be implemented in the same manner.

Figure 16:
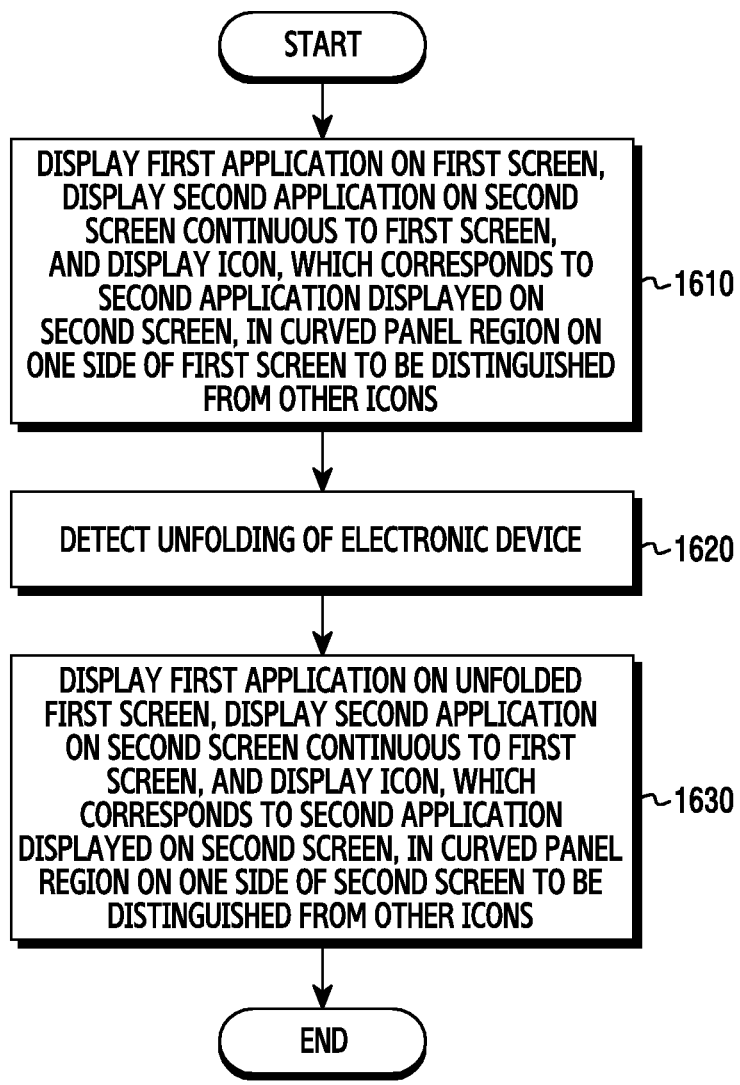
FIG. 16 is a flowchart illustrating an example control method of an example electronic device according to an example embodiment of the present disclosure.

FIG. 16 is a flowchart illustrating an example control method of an example electronic device according to an example embodiment of the present disclosure.

Figure 17:
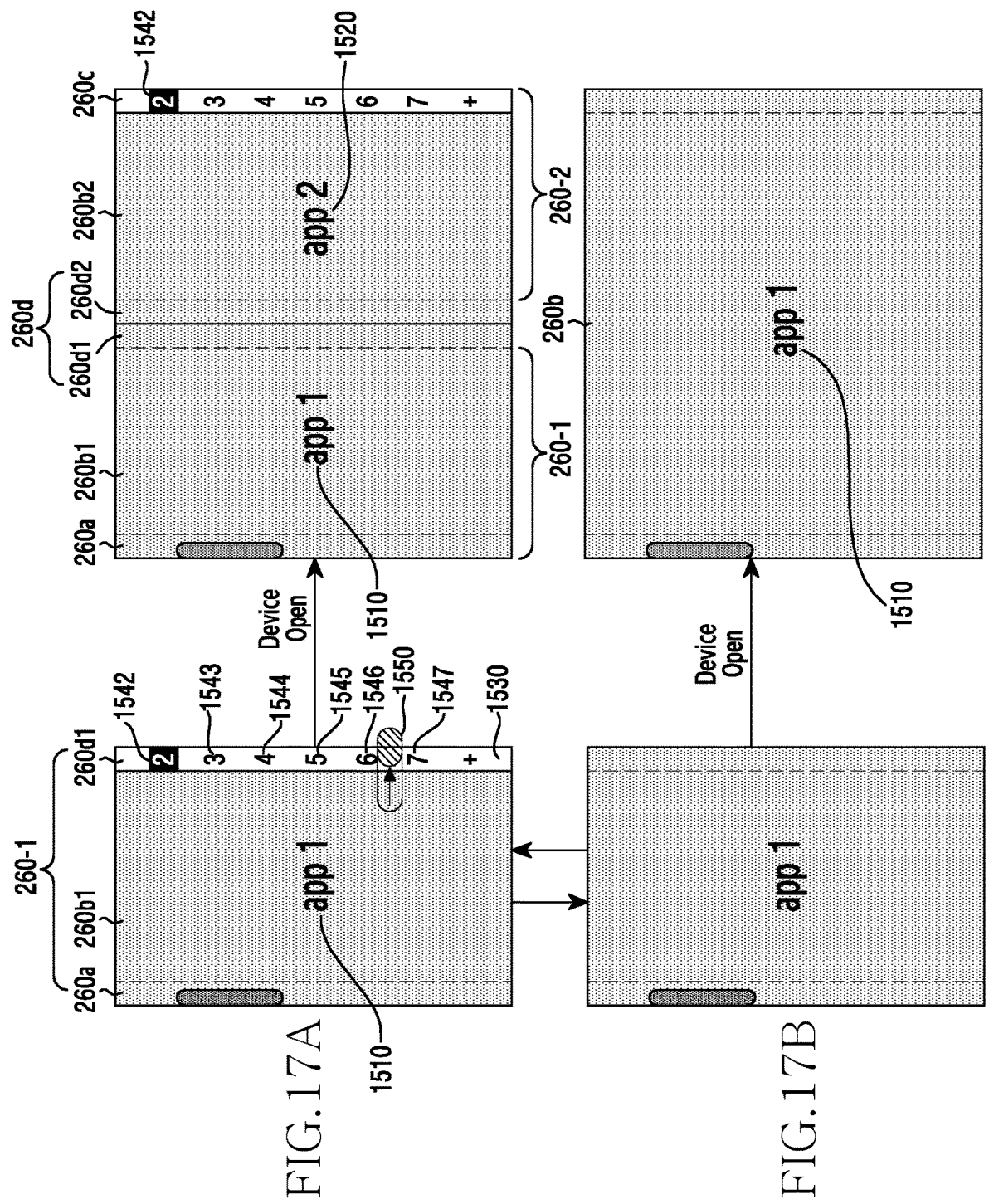
FIGS. 17A and 17B are diagrams illustrating an example of a control method of an example electronic device according to an example embodiment of the present disclosure.

FIGS. 17A and 17B are diagrams illustrating an example of a control method of an example electronic device according to an example embodiment of the present disclosure.

In step 1610 of FIG. 16, the first application is displayed on the first screen, the second application is displayed on the second screen, which is continuous to the first screen, and an icon, which corresponds to the second application displayed on the second screen, is displayed in the curved panel region on one side of the folded first screen to be distinguished from the other icons.

Referring to FIG. 17A, the first application 1510 may be displayed on the first screen 260-1, the second application 1520 may be displayed on the second screen 260-2, which is continuous to the first screen 260-1, an icon 1542, which corresponds to the second application 1520, may be displayed in the curved panel region 1530 on the right side 260d1 of the first screen 260-1 or the left side of the first screen 260-1 (e.g., the left curved region 260a) to be distinguished from the other icons 1543 to 1547. Since step 1610 of FIG. 16 is substantially similar to steps 1410 and 1420 of FIG. 14, a redundant description is not repeated there.

In step 1620 of FIG. 16, the unfolding of the electronic device is detected.

Referring to FIGS. 17A and 17B, a user may unfold the electronic device 201. The electronic device 201 may calculate the unfolding (or opening) of the electronic device 201 using a sensor 310 (e.g., a strain sensor 312, a distance sensor 313, or a gyroscope sensor 314) or the like. Since the unfolding of the electronic device 201 has been described in detail with reference to FIGS. 3 to 4D, a redundant description is not repeated here.

In step 1630 of FIG. 16, the first application is displayed on the unfolded first screen, the second application is displayed on the second screen, which is continuous to the first screen, and an icon, which corresponds to the second application displayed on the second screen, is displayed in the curved panel region on one side of the second screen to be distinguished from the other icons.

Referring to FIG. 17A, the unfolded electronic device 201 may display the first application 1510 on the first screen 260-1 and the second application 1520 on the second screen 260-2, which is continuous to the first screen 260-1, and may display an icon 1542, which corresponds to the second application 1520 displayed on the second screen 260-2, in the curved panel region 1530 on a side of the second screen 260-2 to be distinguished from the other icons 1543 to 1547. In addition, the unfolded electronic device 201 may display the first application 1510 on the second screen 260-2 and the second application 1520 on the first screen 260-1, which is continuous to the second screen 260-2, and the curved panel region 1530 may be displayed in the common curved region 260d. The icon 1542, which corresponds to the second application 1520, may be displayed in the curved panel region 1530 provided in the common curved region 260d to be distinguished from the other icons 1543 to 1547.

In the unfolded electronic device 201, the first screen 260-1 may include a left curved region 260a, a first flat region 260b1, and a right common curved region 260d1 of the first housing 201a. In the unfolded electronic device 201, the second screen 260-2 may include a left common curved region 260d2 of the second housing 201b, a second flat surface region 260b2, and a right curved region 260c of the second housing 201b.

When the electronic device 201, in which the curved panel region 1530 is displayed in the common curved region 260d, is unfolded, the position of the curved panel region 1530 may be fixed to the common curved region 260d. In addition, when the electronic device 201, in which the curved panel region 1530 is displayed in the common curved region 260d, is unfolded, the position of the curved panel region 1530 may be moved to one side 260c of the second screen 260-2.

The electronic device 201 may fix the position of the curved panel region 1530. The electronic device 201 may change the position of the first application 1510 and the position of the second application 1520.

The unfolded electronic device 201 may display the respective applications 1510 and 1520 on the respective screens 260-1 and 260-2. The unfolded electronic device 201 may display one of a plurality of applications 1510 and 1520 on one of the plurality of screens 260-1 and 260-2.

In another embodiment of the present disclosure, referring to FIG. 17B, the curved panel region 1530 may be displayed or may disappear by a user input (e.g., a touch gesture or a touch). In the case where a touch gesture (or touch or swipe 1550) is received from the second flat region 260b2 to the curved panel region 1530, the electronic device 201 may cause the curved panel region 1530 to disappear. In the case where the curved panel region 1530 is not displayed, the electronic device 201 may display the first application 1510 on the first screen (206-1, 260d2, 260b2, 260c).

In the case where the curved panel area 1530 is not displayed, when a touch gesture from the right curved region 260c to the second flat region 260b2 of the second housing 201b is received, the electronic device 201 may display the curved panel region 1530 again.

The unfolding is detected in the electronic device 201 where the curved panel region 1530 is not displayed. In the case where the unfolding is detected in the electronic device 201 where the curved panel region 1530 is not displayed, the electronic device 201 may display the first application 1510 on the touch screen, for example, the first screen 260-1. In the case where unfolding is detected in the electronic device 201 where the curved panel region 1530 is not displayed, the electronic device 201 may display the first application 1510 on the touch screens, for example, the left curved region 260a, the flat region 260b, and the right curved region 260c.

Figure 18:
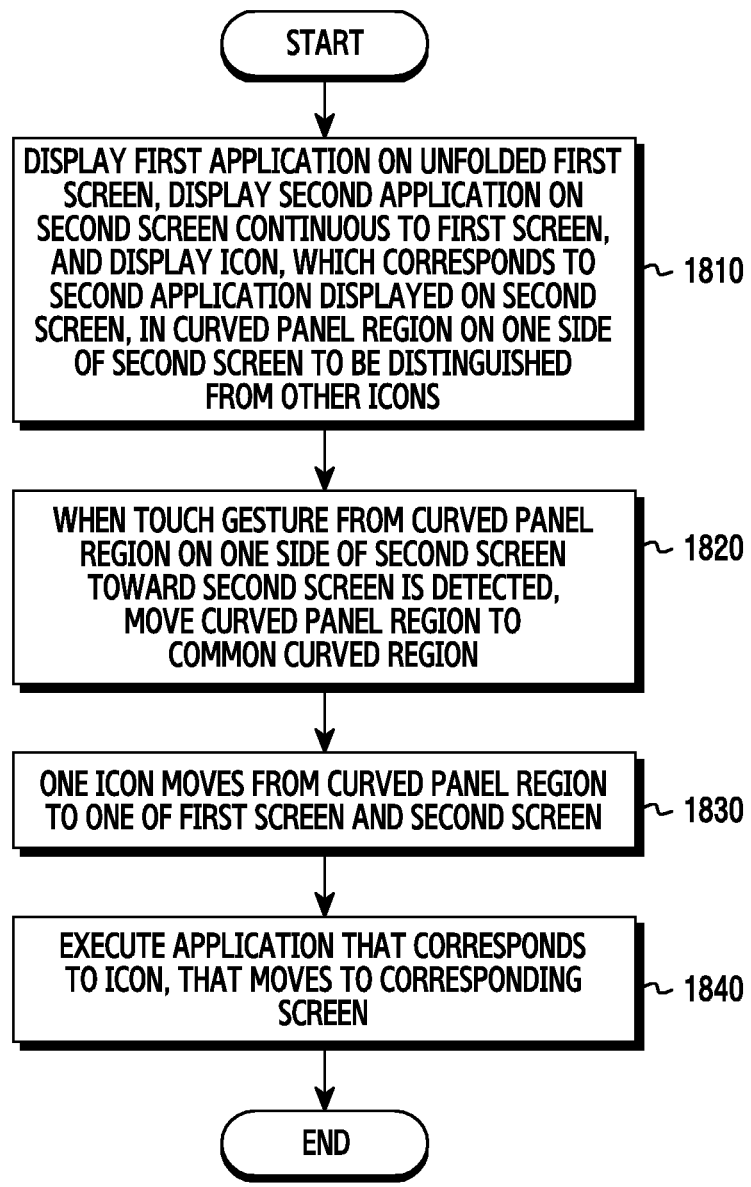
FIG. 18 is a flowchart illustrating an example control method of an example electronic device according to an example embodiment of the present disclosure.

FIG. 18 is a flowchart illustrating an example control method of an example electronic device according to an example embodiment of the present disclosure.

FIGS. 19A, 19B, 19C and 19D are diagrams illustrating an example of a control method of an example electronic device according to an example embodiment of the present disclosure.

In step 1810 of FIG. 18, the first application is displayed on the unfolded first screen, the second application is displayed on the second screen, which is continuous to the first screen, and an icon, which corresponds to the second application displayed on the second screen, is displayed in the curved panel region on one side of the second screen to be distinguished from the other icons.

Referring to FIG. 19A, the first application 1510 may be displayed on the first screen 260-1, the second application 1520 may be displayed on the second screen 260-2, which is continuous to the first screen 260-1, and an icon 1542, which corresponds to the second application 1520, in the curved panel region 1530 on a side of the second screen to be distinguished from the other icons 1543 to 1547. Since step 1810 of FIG. 18 is substantially similar to step 1610 of FIG. 16, a redundant description is not repeated here.

In step 1820 of FIG. 18, when a touch gesture is detected from the curved panel region on one side of the second screen toward the second screen, the curved panel region moves to the common curved region.

Referring to FIG. 19A, the user may input a touch gesture 1551 from the curved panel region 1530 of one side 260c of the second screen 260-2 toward the second flat region 260b2 (for example, the common curved region 260d). When the touch gesture 1551 is received, the electronic device 201 may move the curved panel region 1530. When the touch gesture 1551 is received, the electronic device 201 may display the curved panel region 1530, which is displayed on one side 260c of the second screen 260-2, in the common curved region 260d.

As illustrated in FIG. 19B, when the curved panel region 1530 moves to the common curved region 260d, the electronic device 201 may display the curved panel region 1530 in the common curved region 260d with an area, which is the same as or different from (with a tolerance in the range of ±10%) the area (for example, width×length) of the curved panel region 1530, which has been displayed on one side 260c of the second screen 260-2.

In the case where the curved panel region 1530 is displayed in the common curved region 260d with an area, which is the same as or different from (with a tolerance in the range of ±10%) the area (for example, width×length) of the curved panel region 1530, which has been displayed on one side 260c of the second screen 260-2, the electronic device 201 may expand the first application displayed on the first screen 260-1 (e.g., including a part of the common curved region) or may expand the second application displayed on the second screen 260-2 (e.g., including a part of the common curved region).

In the case where the curved panel region 1530 is displayed in the common curved region 260d with an area, which is the same as or different from (with a tolerance in the range of ±10%) the area (e.g., width×length) of the curved panel region 1530, which has been displayed on one side 260*c* of the second screen 260-2, the electronic device 201 may change (e.g., reduce) the area of the common curved region 260*d* temporarily (e.g., only when the electronic device 201 is unfolded).

When the curved panel region 1530 moves to the common curved region 260*d*, the area (e.g., width×length) of the curved panel region 1530, which has been displayed on one side 260*c* of the second screen 260-2 may be changed (e.g., expanded) depending on the area of the common curved region 260*d*.

In step 1830 of FIG. 18, one icon displayed in the curved panel region moves to one of the first screen and the second screen.

Referring to FIG. 19C, the user may perform the drag 1553 of one icon displayed in the curved panel region of the common curved region 260*d* (e.g., the fourth icon 1544 corresponding to the fourth application) toward the first screen 260-1. In addition, the user may perform the drag 1552 of one icon displayed in the curved panel region of the common curved region 260*d* (e.g., the fifth icon 1545 corresponding to the fifth application) toward the second screen 260-2.

In step 1840 of FIG. 18, the application corresponding to the icon, which is moved to the corresponding screen, is executed.

Referring to FIGS. 19C and 19D, the electronic device 201 may detect the drag 1552 on FIG. 19B of the fourth icon 1544 of FIG. 19B. The electronic device 201 may execute the fourth application (app 4) 1560 corresponding to the fourth icon 1544 and may display the fourth application 1560 on the first screen 260-1 as illustrated in FIG. 19D. In addition, the electronic device 201 may detect the drag 1553 of the fifth icon 1545. The electronic device 201 may execute the fifth application (app 5) 1570 corresponding to the fifth icon 1545 and may display the fifth application 1570 on the second screen 260-2.

The methods according to the various example embodiments of the present disclosure may be in a form of program commands executed through various computer means to be recorded in a computer readable medium. The computer readable medium may include a program command, a data file, a data structure, and the like independently or in combination. The computer readable medium may be stored, for example, in a volatile or non-volatile storage device such as a ROM, a memory such as a RAM, a memory chip, a memory device, or a memory IC, or a storage medium that is optically or magnetically recordable and simultaneously machine (for example, a computer)-readable, such as a CD, a DVD, a magnetic disk, or a magnetic tape, regardless of its ability to be erased or re-recorded.

It will be appreciated that the storage unit included in the electronic device is one example of the machine-readable storage media suitable for storing a program or programs including commands for implementing various embodiments of the present disclosure. The program command recorded in the medium may be things specially designed and configured for the present disclosure, or things that are well known to and can be used by those skilled in the computer software related art.

Although the present disclosure has been described with reference to various example embodiments and the drawings as described above, the present disclosure is not limited to the aforementioned example embodiments, and various modifications and alterations can be made from the descriptions by those skilled in the art to which the present disclosure pertains.

Accordingly, the scope of the present disclosure should not be determined by the above-described example embodiments, and should be determined by not only the following claims but also their equivalents.

According to various example embodiments of the present disclosure, it is possible to provide an out-foldable (or foldable) electronic device including a support sheet that supports a display in an out-folded (or folded) common curved region of the electronic device, and a method of controlling the foldable electronic device.

What is claimed is:

1. An electronic device comprising:
   a first housing including a first top face facing a first direction, and a first bottom face facing a second direction opposite to the first direction in a second state;
   a second housing including a second top face facing a third direction, and a second bottom face facing a fourth direction opposite to the third direction in the second state;
   a touch screen display continuously disposed between the first top face of the first housing and the first bottom face of the first housing and between the second top face of the second housing and the second bottom face of the second housing, the touch screen display being viewable through at least the first top face and the second top face, wherein the touch screen display includes a flat region, at least one curved region, and a folding region;
   a connection structure comprising hinges configured to pivotably connect the first housing and the second housing, wherein the first housing is configured to be folded with respect to the second housing using the hinges, the connection structure comprising hinges comprising a first hinge and a second hinge provided proximate different respective sides of the connection structure, the second hinge being spaced apart from the first hinge in direction of a folding axis;
   the connection structure further comprising hinge covers disposed over the hinges in direction of a rotation axis of the hinge, and configured to cover the hinges when the hinges are viewed from outside of the electronic device; and
   support sheets disposed between the first hinge and the second hinge and disposed under the folding region to prevent or reduce the folding region of the touch screen display from deflection by a user touch on the folding region,
   wherein the folding region and the flat region of the touch screen display form one planar display area in a first state where the first top face is parallel to the second top face,
   wherein the folding region in the second state distinct from the first state forms a curved display area extended from the flat region.

2. The electronic device of claim 1, wherein the hinges include a biaxial hinge, and the biaxial hinge includes a biaxial click hinge or a biaxial free stop hinge.

3. The electronic device of claim 1, wherein, at least one of the first housing and the second housing is configured to be locked by the hinges when at least one of the first housing and the second housing reaches a set angle.

4. The electronic device of claim 1, wherein the hinge covers include a semicircular hinge cover and a fan-shaped hinge cover, or a fan-shaped hinge cover and a free-type hinge cover configured to prevent and/or reduce the hinges from being axially exposed.

5. The electronic device of claim 4, wherein, a part of the fan-shaped hinge cover is configured to be covered by the semicircular hinge cover disposed outside the fan-shaped hinge cover when the electronic device is folded.

6. The electronic device of claim 4, wherein, a part of the fan-shaped hinge cover is configured to be covered by the free-type hinge cover located outside the fan-shaped hinge cover when the electronic device is folded.

7. The electronic device of claim 1, further comprising:
a flexible slide cover of the connection structure, the slide cover configured to cover a part of the first bottom face of the first housing and a part of the second bottom face of the second housing.

8. The electronic device of claim 7, wherein one end of the flexible slide cover is connected to a cover guide rail, of the connection structure, which is connected to a shaft of the hinge, and another end of the flexible slide cover is connected to one of the first housing and the second housing.

9. The electronic device of claim 7, wherein one end of the flexible slide cover is configured to move along a recess of the cover guide rail.

10. The electronic device of claim 7, wherein the flexible slide cover is configured to be folded to correspond to the electronic device when the electronic device is folded.

11. The electronic device of claim 1, wherein the support sheet includes a single group of support sheet members including a plurality of semicircular support sheet members or a plurality of groups of support sheet members each including a plurality of semicircular support sheet members.

12. The electronic device of claim 11, wherein one end of one support sheet member of the plurality of support sheet members is connected to one of a plurality of bars positioned in an axial direction of the hinge.

13. The electronic device of claim 12, wherein the hinge covers include a semicircular hinge cover and a fan-shaped hinge cover, and
wherein one end of one bar of the plurality of bars is connected to one of the semicircular hinge cover and the fan-shaped hinge cover of the hinge covers.

14. The electronic device of claim 12, wherein the hinge covers include a free-type hinge cover, and
wherein one end of one bar of the plurality of bars is connected to the free-type hinge cover of the hinge covers.

15. The electronic device of claim 1, wherein a resolution of the touch screen display in a folded state and a resolution of the touch screen display in an opened state differ from each other.

16. The electronic device of claim 1, wherein a number of the curved regions in a first screen corresponding to the first top face of the first housing from among the folded touch screen displays is equal to a number of the curved regions of the opened touch screen display.

17. The electronic device of claim 1, wherein a left curved region of a first screen corresponding to the first top face of the first housing from among the folded touch screen displays and a right curved region of a second screen corresponding to the second top face of the second housing from among the folded touch screen displays are discontinuous.

18. The electronic device of claim 1, wherein a right common curved region of a first screen corresponding to the first top face of the first housing from among the folded touch screen displays and a left common curved region of a second screen corresponding to the second top face of the second housing from among the folded touch screen displays are continuous.

19. The electronic device of claim 1, wherein no physical button is provided in a lower end of the touch screen display located in a central portion of a top face of the electronic device.

20. An electronic device comprising:
a first housing including a first top face facing a first direction, and a first bottom face facing a second direction opposite to the first direction in a second state;
a second housing including a second top face facing a third direction, and a second bottom face facing a fourth direction opposite to the third direction in a second state;
a touch screen display continuously disposed between the first top face of the first housing and the first bottom face of the first housing and between the second top face and the second bottom face of the second housing, the touch screen display being viewable through at least the first top face and the second top face, wherein the touch screen display includes a flat region, at least one curved region, and a folding region;
a connection structure comprising hinges configured to pivotably connect the first housing and the second housing, wherein the first housing is folded with respect to the second housing using the hinges, the hinges comprising a first hinge and a second hinge provided proximate different respective sides of the connection structure, the second hinge being spaced apart from the first hinge in direction of a folding axis; and
support sheets disposed between the first hinge and the second hinge and disposed under the folding region to prevent or reduce the folding region of the touch screen display from deflection by a user touch on the folding region,
wherein the folding region and the flat region of the touch screen display form one planar display area in a first state where the first top face is parallel to the second top face,
wherein the folding region in the second state distinct from the first state forms a curved display area extended from the flat region.

* * * * *